US012538680B2

(12) United States Patent
Lee et al.

(10) Patent No.: US 12,538,680 B2
(45) Date of Patent: Jan. 27, 2026

(54) DISPLAY PANEL AND ELECTRONIC APPARATUS INCLUDING THE SAME

(71) Applicant: Samsung Display Co., Ltd., Yongin-si (KR)

(72) Inventors: Jaewoo Lee, Cheonan-si (KR); Yongsu Lee, Seoul (KR); Seung-Jun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 683 days.

(21) Appl. No.: 17/891,505

(22) Filed: Aug. 19, 2022

(65) Prior Publication Data

US 2023/0143823 A1 May 11, 2023

(30) Foreign Application Priority Data

Nov. 8, 2021 (KR) .................. 10-2021-0152358

(51) Int. Cl.
*H10K 59/131* (2023.01)
(52) U.S. Cl.
CPC ................ *H10K 59/1315* (2023.02)
(58) Field of Classification Search
CPC ............ H10K 59/1315; H10K 59/131; H10K 59/121; H10K 59/40; H10K 59/65; H10D 86/441; H10D 86/60
See application file for complete search history.

(56) References Cited

U.S. PATENT DOCUMENTS

| 10,025,410 | B2* | 7/2018 | Kim ................... G06F 3/0443 |
| 10,312,309 | B2 | 6/2019 | Lin et al. |
| 2009/0102758 | A1* | 4/2009 | Anzai ................. G09G 3/3266 345/76 |
| 2018/0039146 | A1 | 2/2018 | Tanaka et al. |
| 2019/0278145 | A1* | 9/2019 | Tanaka .............. G02F 1/136286 |
| 2021/0035496 | A1* | 2/2021 | Cho ..................... H10D 86/441 |
| 2021/0273035 | A1* | 9/2021 | Cho ..................... H10K 77/111 |
| 2021/0296424 | A1 | 9/2021 | Cho et al. |

FOREIGN PATENT DOCUMENTS

| KR | 10-2019-0047483 | 5/2019 |
| KR | 10-2020-0010697 | 1/2020 |
| KR | 10-2020-0017012 | 2/2020 |
| KR | 10-2021-0014810 | 2/2021 |

* cited by examiner

*Primary Examiner* — Pegeman Karimi
(74) *Attorney, Agent, or Firm* — Sughrue Mion, PLLC

(57) ABSTRACT

A display panel and an electronic apparatus including the display panel are provided. The display panel includes a base layer including a display area and a non-display area, signal lines disposed in a first direction, each of the signal lines extending in a second direction intersecting the first direction, and connection patterns. Each of the connection patterns include a first line electrically connected to at least one of the signal lines through a contact portion and extending in the first direction, and a second line electrically connected to the first line and extending in the second direction. The contact portion between the first line and the at least one of signal lines is disposed in the display area, and the first lines of the connection patterns have a same length.

21 Claims, 14 Drawing Sheets

DISPLAY PANEL AND ELECTRONIC APPARATUS INCLUDING THE SAME

CROSS-REFERENCE TO RELATED APPLICATION(S)

This application claims priority to and benefits of Korean Patent Application No. 10-2021-0152358 under 35 U.S.C. § 119, filed on Nov. 8, 2021 in the Korean Intellectual Property Office, the entire contents of which are incorporated herein by reference.

BACKGROUND

1. Technical Field

The disclosure herein relates to a display panel and an electronic apparatus including the same, and, to a display panel having a reduced size of a non-display area.

2. Description of the Related Art

Multimedia electronic apparatuses such as televisions, mobile phones, tablet computers, navigation devices, game console, and the like may include a display panel for displaying an image. Display panels may include pixels for generating an image and signal lines connected to the pixels. As the integration density of elements included in display panels and the number of signal lines increase, the size of an area for arranging signal lines may increase. Research is necessary to reduce the size of an area in which signal lines are arranged in order to provide users with electronic apparatuses having large display areas.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel having a reduced size of a non-display area that is a dead space and having improved display quality and an electronic apparatus including the same.

An embodiment provides a display panel that may include a base layer including a display area and a non-display area; signal lines disposed in a first direction, each of the signal lines extending in a second direction intersecting the first direction; and connection patterns. The connection patterns may include first lines and second lines; and each of the first lines electrically connected to at least one of the signal lines through a contact portion and extending in the first direction and each of the second lines electrically connected to a corresponding first line among the first lines and extending in the second direction, wherein the contact portion between the first lines and the signal lines may be disposed in the display area, and the first lines of the connection patterns have a same length.

In an embodiment, the second lines of the connection patterns may be disposed between the signal lines in a plan view.

In an embodiment, the first lines of the connection patterns and the second lines of the connection patterns may be disposed on different layers.

In an embodiment, the first lines and the second lines of the connection patterns may be disposed on a same layer and may be integral with each other.

In an embodiment, the second lines of the connection patterns and the signal lines may be disposed on a same layer.

In an embodiment, each of the first lines may intersect at least one of the signal lines in a plan view, and each of the first lines may have a same number of overlapping signal lines in a plan view.

In an embodiment, the signal lines may include signal lines of a first group each electrically connected to the first lines of the connection patterns; and signal lines of a second group insulated from the signal lines of the first group and intersecting at least one of the first lines of the connection patterns.

In an embodiment, the base layer may include sides extending in the second direction, and the signal lines of the first group may be disposed closer to the sides of the base layer than the signal lines of the second group.

In an embodiment, the display panel may further include a load block electrically connected to at least one of the signal lines of the second group.

In an embodiment, the load block may include at least one capacitor.

In an embodiment, the at least one capacitor may include a plurality of capacitors and electrically connected to different signal lines of the second group, respectively, and the plurality of capacitors may include a first capacitor electrically connected to a first signal line among the signal lines of the second group; and a second capacitor electrically connected to a second signal line among the signal lines of the second group, the first signal line may be disposed closer to the signal lines of the first group than the second signal line in the first direction, and a capacitance of the first capacitor may be larger than a capacitance of the second capacitor.

In an embodiment, the load block may include at least one resistance compensation pattern, the at least one resistance compensation pattern may include a first portion and a second portion each electrically connected to a corresponding signal line among the signal lines of the second group and extending in the first direction; and a third portion electrically connected to the first portion and the second portion and extending in the second direction.

In an embodiment, the first portion, the second portion, and the third portion may be disposed on different layers.

In an embodiment, the first portion, the second portion, and the first lines of the connection patterns may be disposed on a same layer.

In an embodiment, the at least one resistance compensation pattern may include a plurality of resistance compensation patterns and may be electrically connected to different signal lines of the second group, respectively, the plurality of resistance compensation patterns may include a first resistance compensation pattern electrically connected to a first signal line among the signal lines of the second group; and a second resistance compensation pattern electrically connected to a second signal line among the signal lines of the second group, the first signal line may be disposed closer to the signal lines of the first group than the second signal line in the first direction, and a resistance of the first resistance compensation pattern may be larger than a resistance of the second resistance compensation pattern.

In an embodiment, a sum of lengths of a first portion and a second portion of the first resistance compensation pattern may be greater than a sum of lengths of a first portion and a second portion of the second resistance compensation pattern.

In an embodiment, each of the first portion of the first resistance compensation pattern and the first portion of the second resistance compensation pattern may overlap at least one of the signal lines in a plan view, and a number of signal lines overlapping the first portion of the first resistance compensation pattern in a plan view may be greater than a number of signal lines overlapping the first portion of the second resistance compensation pattern in a plan view.

In an embodiment, an electronic apparatus may include a display panel including a base layer; a circuit element layer disposed on the base layer; and a display element layer disposed on the circuit element layer. The circuit element layer may include signal lines disposed on the base layer, disposed in a first direction, and each of the signal lines extending in a second direction intersecting the first direction; connection patterns each including a first line extending in the first direction; and a second line electrically connected to the first line and extending in the second direction; and a load block. The signal lines may include signal lines of a first group each electrically connected to the first lines of the connection patterns; signal lines of a second group insulated from the signal lines of the first group and intersecting the first lines of the connection patterns; and signal lines of a third group insulated from the signal lines of the second group and spaced apart from the connection patterns, the load block may be connected to at least one of the signal lines of the second group, and the first lines of the connection patterns may have a same length.

In an embodiment, the electronic apparatus may further include an input sensing layer disposed on the display panel that senses an external input.

In an embodiment, the electronic apparatus may further include a camera module disposed below the display panel.

In an embodiment, a display panel may include a base layer; signal lines disposed on the base layer, disposed in a first direction, and each of the signal lines extending in a second direction intersecting the first direction; connection patterns each including a first line extending in the first direction; and a second line electrically connected to the first line and extending in the second direction; and resistance compensation patterns each including a first portion and a second portion extending in the first direction; and a third portion electrically connected to each of the first portion and the second portion and extending in the second direction. The signal lines may include signal lines of a first group respectively electrically connected to the connection patterns; and signal lines of a second group spaced apart from the signal lines of the first group in the first direction and respectively electrically connected to the resistance compensation patterns, and lengths of the first portions of the resistance compensation patterns may gradually decrease as a signal line connected to the first portion is disposed farther away from the signal lines of the first group.

In an embodiment, lengths of the first lines of the connection patterns may be equal, and a length of each of the first portions of each of the resistance compensation patterns may be different from the lengths of each of the first lines.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1A:
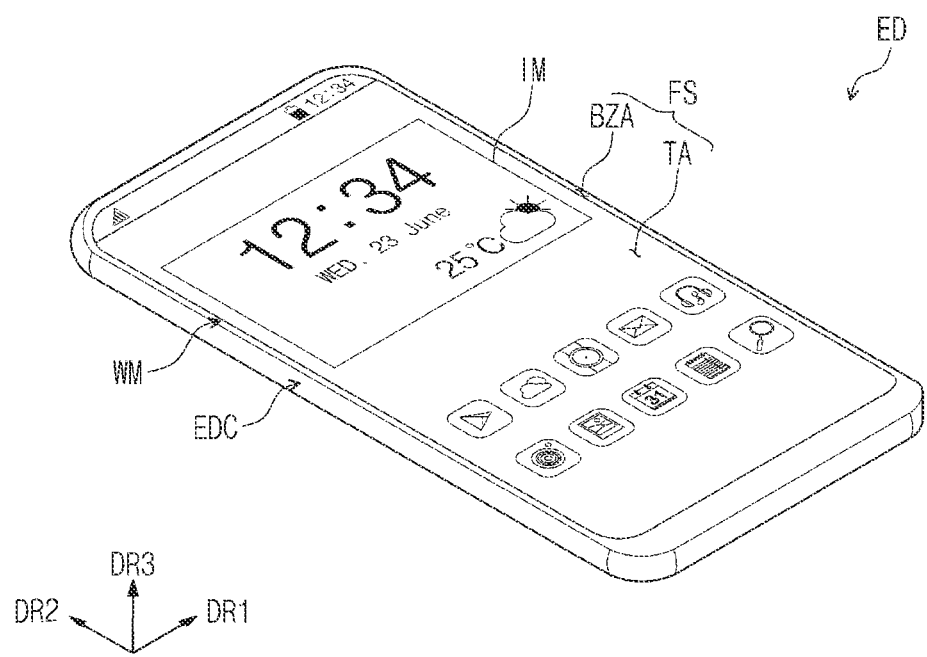
FIG. 1A is a schematic perspective view of an electronic apparatus according to an embodiment.

Embodiments may be variously modified and may include various modes. However, embodiments are illustrated in the drawings and are described in detail below. However, it should be understood that the disclosure is not limited to specific forms, but rather cover all modifications, equivalents or alternatives that fall within the spirit and scope of the disclosure.

It will be understood that when an element (or a region, layer, portion, or the like) is referred to as being "on", "connected to", or "coupled to" another element, it can be directly on or directly connected/coupled to the other element, or a third element may be present therebetween.

It will be understood that the terms "connected to" or "coupled to" may include a physical or electrical connection or coupling.

The same reference numerals refer to the same elements. In the drawings, the thicknesses, ratios, and dimensions of elements may be exaggerated for clarity of illustration.

The terms "first", "second" and the like may be used for describing various elements, but the elements should not be construed as being limited by the terms. Such terms are only used for distinguishing one element from other elements. For example, a first element could be termed a second element and vice versa without departing from the teachings of the disclosure.

The terms of a singular form may include plural forms unless otherwise specified. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Furthermore, the terms "under", "lower side", "on", "upper side", and like are used to describe association relationships among elements illustrated in the drawings. The terms, which are relative concepts, are used on the basis of directions illustrated in the drawings but are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

All of the terms used or implied herein (including technical and scientific terms) have the same meanings as understood by those skilled in the art, unless otherwise defined. Terms in common usage such as those defined in commonly used dictionaries should be interpreted to contextually match the lexical meanings in the relevant art, and should not be interpreted in an idealized or overly formal sense unless otherwise defined explicitly.

Hereinafter, a display panel according to an embodiment and an electronic apparatus including the same will be described with reference to the accompanying drawings.

Figure 1B:
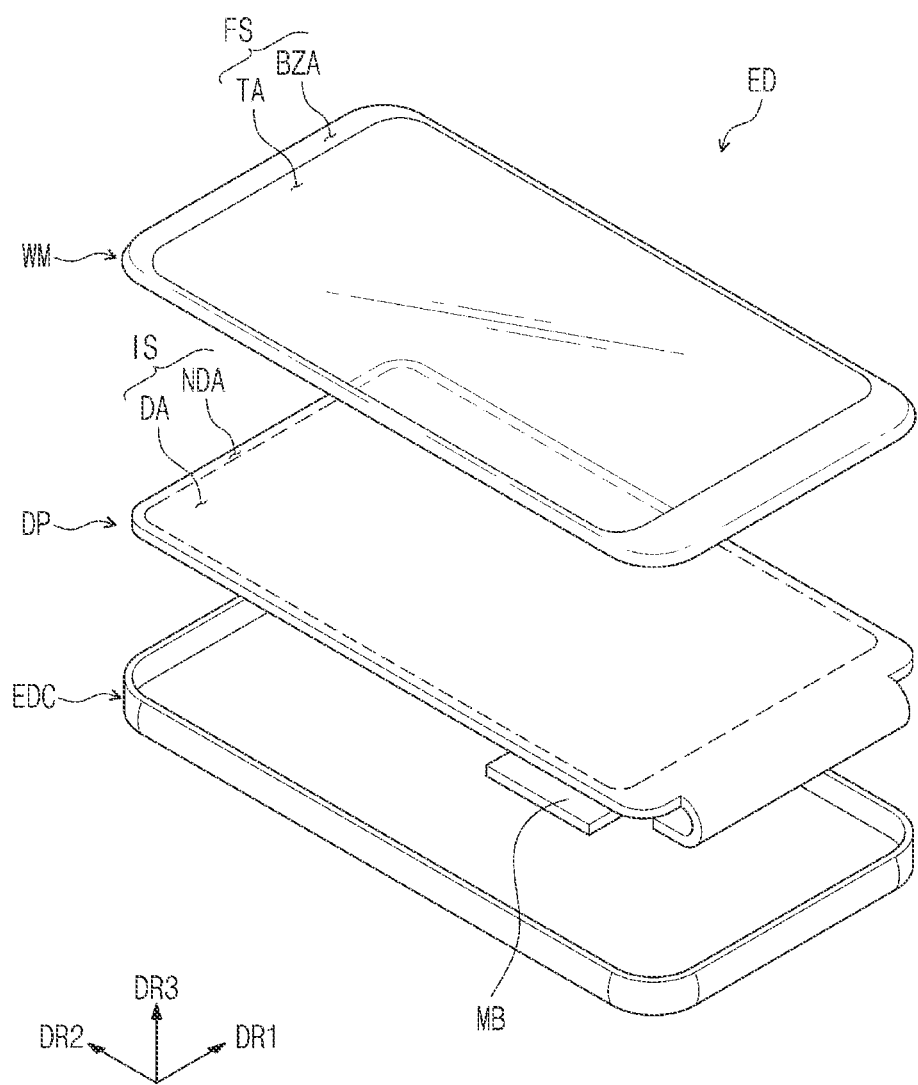
FIG. 1B is an exploded perspective view of an electronic apparatus according to an embodiment.

FIG. 1A is a schematic perspective view illustrating an electronic apparatus according to an embodiment. FIG. 1B is an exploded perspective view of an electronic apparatus according to an embodiment.

An electronic apparatus ED may be an apparatus which is activated and displays an image according to an electric signal. For example, the electronic apparatus ED may include a large-size apparatus such as a television, an outdoor advertising board, and the like and a small- or medium-size apparatus such as a monitor, a mobile phone, a tablet computer, a navigation device, a game console, and the like within the spirit and the scope of the disclosure. Embodiments of the electronic apparatus ED are illustrative, and the electronic apparatus ED is not limited to any one of the embodiments. In an embodiment, a mobile phone is illustrated as an example of the electronic apparatus ED.

Referring to FIG. 1A, in a plan view, the electronic apparatus ED may have a rectangular shape having short sides extending in a first direction DR1 and long sides extending in a second direction DR2 intersecting the first direction DR1. However, an embodiment is not limited thereto, and the electronic apparatus ED may have various shapes such as a circle and a polygon in a plan view. It is to be understood that the shapes disclosed herein may also include shapes substantial to the disclosed shapes.

The electronic apparatus ED of an embodiment may be flexible. The term "flexible" represents a bendable characteristic, and may encompass any structure that is completely folded or capable of being bent to a degree of several nanometers. For example, the flexible electronic apparatus ED may include a curved apparatus or foldable apparatus. However, an embodiment is not limited thereto, and the electronic apparatus ED may be rigid.

The electronic apparatus ED may display an image IM in a third direction DR3 on a display surface parallel to each of the first direction DR1 and the second direction DR2. The image IM provided by the electronic apparatus ED may include not only a moving image but also a still image. FIG. 1A illustrates a clock widget and icons as examples of the image IM.

The display surface, on which the image IM is displayed, may correspond to a front surface of the electronic apparatus ED, which may correspond to a front surface FS of a window WM. Although FIG. 1A illustrates a planar display surface as an example, an embodiment is not limited thereto, and the display surface of the electronic apparatus ED may include a curved surface bent from at least one side or a side of a plane.

A front surface (or upper surface) and a rear surface (or lower surface) of each of members (or units) constituting the electronic apparatus ED may oppose each other in the third direction DR3, and a normal direction of each of the front surface and the rear surface may substantially parallel with the third direction DR3. A separation distance between the front surface and the rear surface in the third direction DR3 may correspond to a thickness of a member (or unit). Herein, the term "in a plan view" may be defined as a state viewed in the third direction DR3. Herein, the term "in a cross-sectional view" may be defined as a state viewed in the first direction DR1 or the second direction DR2. The directions indicated by the first to third directions DR1 to DR3 are relative concept and thus may be changed to other directions.

Referring to FIGS. 1A and 1B, the electronic apparatus ED may include the window WM, a display panel DP, and a case EDC. The window WM may be coupled or connected to the case EDC to form an exterior of the electronic apparatus ED and provide an internal space for accommodating components of the electronic apparatus ED.

The window WM may be disposed on the display panel DP. The window WM may have a shape corresponding to a shape of the display panel DP. The window WM may cover or overlap an entire front surface of the display panel DP and may protect the display panel DP from an external impact and scratch.

The window WM may include an optically clear insulating material. For example, the window WM may include a glass substrate or a polymer substrate. The window WM may have a single-layer or multi-layer structure. The window WM may further include functional layer such as an anti-fingerprint layer, a phase control layer, and a hard coating layer.

The front surface FS of the window WM may include a transmission area TA and a bezel area BZA. The transmission area TA of the window WM may be an optically clear area. The window WM may transmit, through the transmission area TA, the image IM provided by the display panel DP, and a user may view the image IM.

The bezel area BZA of the window WM may be provided as an area printed with a material having a color. The bezel area BZA of the window WM may prevent a component of the display panel DP overlapping the bezel area BZA from being externally viewed.

The bezel area BZA may be adjacent to the transmission area TA. A shape of the transmission area TA may be substantially defined by the bezel area BZA. For example, the bezel area BZA may be disposed outside the transmission area TA and surround the transmission area TA. However, this is illustrative, and the bezel area BZA may be adjacent to only one side or a side of the transmission area TA, or may not be provided. Furthermore, the bezel area BZA may be disposed on a side surface of the electronic apparatus ED rather than the front surface of the electronic apparatus ED.

The display panel DP may be disposed between the window WM and the case EDC. The display panel DP may display the image IM according to an electric signal. The display panel DP according to an embodiment may be an emissive display panel, but is not particularly limited thereto. For example, the display panel DP may be an organic light-emitting display panel, an inorganic light-emitting display panel, or a quantum dot light-emitting display panel. An emission layer of the organic light-emitting display panel may include an organic light-emitting material, and an emission layer of the inorganic light-emitting display panel may include an inorganic light-emitting material. An emission layer of the quantum dot light-emitting display panel may include quantum dots, quantum rods, etc. within the spirit and the scope of the disclosure. Hereinafter, the display panel DP will be described as an organic light-emitting display panel.

The image IM provided by the electronic apparatus ED may be displayed on a front surface IS of the display panel DP. The front surface IS of the display panel DP may include a display area DA and a non-display area NDA. The display area DA may be an area which is activated and displays the image IM according to an electric signal. According to an embodiment, the display area DA of the display panel DP may overlap the transmission area TA of the window WM.

In the disclosure, the wording "area/portion overlaps another area/portion" is not limited to cases in which the area/portions have a same size and/or a same shape.

The non-display area NDA may be adjacent to an outer side of the display area DA. For example, the non-display area NDA may surround the display area DA. However, an embodiment is not limited thereto, and the non-display area NDA may be defined as various shapes.

The non-display area NDA may be an area in which a driving circuit or driving wiring for driving elements disposed in the display area DA, various signal lines for providing electric signals, and pads are disposed. The non-display area NDA of the display panel DP may overlap the bezel area BZA of the window WM. Components of the display panel DP disposed in the non-display area NDA may be prevented by the bezel area BZA from being externally viewed.

The electronic apparatus ED may include a circuit board MB connected to the display panel DP. The circuit board MB may be connected to one end or an end of the display panel DP extending in the first direction DR1. The circuit board MB may generate an electric signal provided to the display panel DP. For example, the circuit board MB may include a timing controller, which generates a signal provided to a driver of the display panel DP in response to control signals received externally.

At least a portion of the non-display area NDA of the display panel DP may be bent. One portion or a portion of the display panel DP to which the circuit board MB is connected may be bent so that the circuit board MB faces a rear surface of the display panel DP. The circuit board MB may be disposed and assembled so as to overlap the display panel DP in a plan view. However, an embodiment is not limited thereto, and the display panel DP and the circuit board MB may be connected to each other through a flexible circuit board connected to one end or an end of each of the display panel DP and the circuit board MB.

The case EDC may be disposed under or below the display panel DP and may accommodate the display panel DP. The case EDC may include a material having a relatively high rigidity, such as glass, plastic, or metal materials. The case EDC may protect the display panel DP by absorbing an externally applied impact or preventing foreign material, moisture, or the like from permeating the display panel DP.

The electronic apparatus ED according to an embodiment may further include an input sensing layer, which is disposed on the display panel DP and senses an external input applied externally. The input sensing layer may sense various external inputs such as externally provided force, pressure, temperature, and light. For example, the input sensing layer may sense contact with a user's body or pen provided from an outside of the electronic apparatus ED or an input (for example, hovering) applied in proximity to the electronic apparatus ED.

Furthermore, the electronic apparatus ED may further include an electronic module including various functional modules for operating the display panel DP and a power supply module for supplying required power to the electronic apparatus ED. For example, the electronic apparatus ED may include a camera module as an example of the electronic module and the camera module may be disposed under or below the display panel DP.

Figure 2:
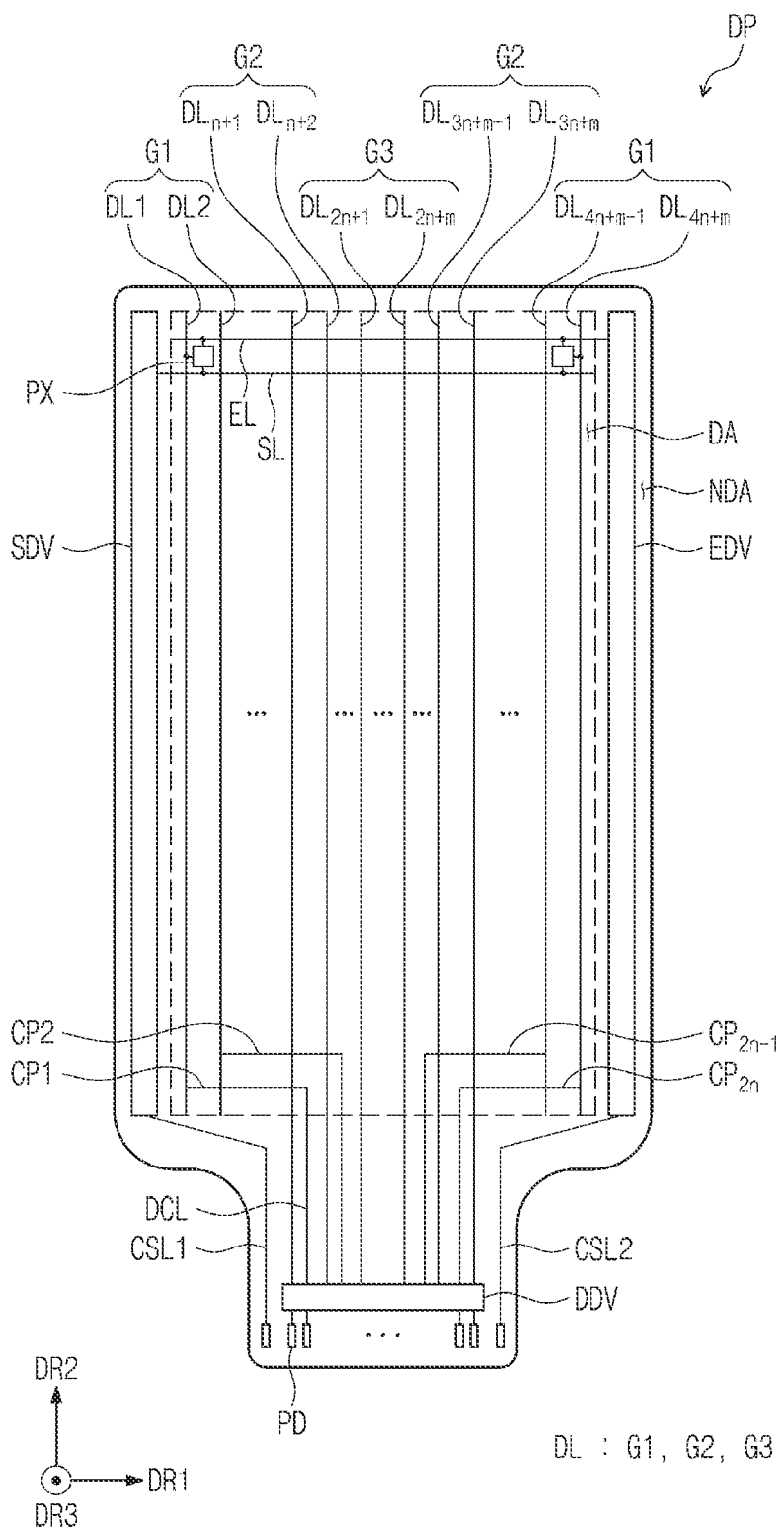
FIG. 2 is a schematic plan view illustrating a display panel according to an embodiment.

FIG. 2 is a schematic plan view of a display panel according to an embodiment. The display panel DP may include pixels PX, signal lines electrically connected to the pixels PX, a scan driver SDV, a data driver DDV, and an emission driver EDV.

The pixels PX may be disposed in the display area DA. Each of the pixels PX may include a light-emitting element described below, transistors (for example, switching transistor, driving transistor, etc.) connected to the light-emitting element, and a capacitor. Each of the pixels PX may emit light according to an electric signal applied to the pixels PX.

Each of the scan driver SDV, the data driver DDV, and the emission driver EDV may be disposed in the non-display area NDA of the display panel DP. Each of the scan driver SDV and the emission driver EDV may be disposed in the non-display area NDA adjacent to long sides of the display panel DP.

The data driver DDV may be disposed in the non-display area NDA adjacent to a short side of the display panel DP. The data driver DDV may be provided in a form of an integrated circuit chip defined as a driving chip and may be mounted in the non-display area NDA of the display panel DP. However, an embodiment is not limited thereto, and the data driver DDV may be electrically connected to the display panel DP by being mounted on a separate printed circuit board connected to the display panel DP.

The signal lines may include scan lines SL, data lines DL, emission lines EL, first and second control lines CSL1 and CSL2, connection lines DCL, and a power supply line (not shown). Each of the pixels PX may be connected to a corresponding scan line among the scan lines SL and a corresponding data line among the data lines DL. An embodiment is not limited thereto, and more various types of signal lines may be provided to the display panel DP according to a configuration of a pixel driving circuit of the pixels PX.

FIG. 2 illustrates one scan line SL among the scan lines SL and one emission line EL among the emission lines EL. The scan line SL may extend in the first direction DR1 and may be connected to the scan driver SDV. The scan line SL may be provided in plural and may be arranged (or disposed) in the second direction DR2. The emission line EL may extend in the first direction DR1 and may be connected to the emission driver EDV. The emission line EL may be provided in plural and may be arranged in the second direction DR2. Although not illustrated, a power supply line may be disposed in the non-display area NDA and may be connected to the pixels PX through a conductive line. The power supply line may provide a reference voltage to the pixels PX.

The data lines DL may extend in the second direction DR2 and may be arranged in the first direction DR1. The data lines DL may be divided into a first group G1, a second group G2, and a third group G3.

The display panel DP may include connection patterns CP1, CP2, $CP_{2n-1}$, and $CP_{2n}$ disposed in the display area DA. Each of the data lines DL1, DL2, $DL4_{n+m-1}$, and $DL4_{n+m}$ of the first group G1 may be connected to a corresponding connection pattern among the connection patterns CP1, CP2, $CP_{2n-1}$, and $CP_{2n}$. The data lines $DL_{n+1}$, $DL_{n+2}$, $DL3_{n+m-1}$, and $DL3_{n+m}$ of the second group G2 may overlap at least one of the connection patterns CP1, CP2, $CP_{2n-1}$, and $CP2n$ in a plan view. The data lines $DL_{2n+1}$ and $DL_{2n+m}$ of the third group G3 may not overlap the connection patterns CP1, CP2, $CP_{2n-1}$ in a plan view. Here, n may be a natural number, and m may be 0 or a natural number.

The data lines DL1, DL2, $DL_{4n+m-1}$, and $DL_{4n+m}$ of the first group G1 may be arranged adjacent to outer boundaries of the display area DA extending in the second direction DR2. Some or a number of data lines DL1 and DL2 of the data lines DL1, DL2, $DL_{4n+m-1}$, and $DL_{4n+m}$ of the first group G1 may be arranged in the first direction DR1 from a left boundary of the display area DA to a center portion of the display area DA. For example, some or a number of data lines DL1 and DL2 of the data lines DL1, DL2, $DL_{4n+m-1}$, and $DL_{4n+m}$ of the first group G1 disposed on a left side may be arrayed in n columns along to the first direction DR1. FIG. 2 illustrates, as an example, the data lines DL1 and DL2 of the first group G1 arranged in a first column and a second column.

The data lines $DL_{n+1}$, $DL_{n+2}$, $DL3_{n+m-1}$, and $DL3_{n+m}$ of the second group G2 may be arranged in the first direction DR1 from a data line disposed closest to the center portion of the display area DA, among the data lines DL1, DL2, $DL4_{n+m-1}$, and $DL4_{n+m}$ of the first group G1, to the center portion of the display area DA. Some or a number of data lines $DL_{n+1}$ and $DL_{n+2}$ of the data lines $DL_{n+1}$, $DL_{n+2}$, $DL3_{n+m-1}$, and $DL3_{n+m}$ of the second group G2 arranged adjacent to the left boundary of the display area DA may be arrayed in the first direction DR1 from a data line of an nth column of the first group G1. Therefore, a data line of the second group G2 disposed closest to the data lines DL1 and DL2 of the first group G1 disposed on the left side may be a data line of an (n+1)th column. The data lines $DL_{n+1}$ and $DL_{n+2}$ of the second group G2 disposed on the left side may include data lines arranged in an (n+1)th column to (2n)th column along to the first direction DR1, and FIG. 2 illustrates, as an example, the data lines $DL_{n+1}$ and $DL_{n+2}$ of the second group G2 arranged in an (n+1)th column and an (n+2)th column.

The data lines $DL_{2+1}$ and $DL_{2n+m}$ of the third group G3 may be arranged in an area corresponding to the center portion of the display area DA. The data lines $DL_{2n+1}$ and $DL_{2n+m}$ of the third group G3 may be arranged in the first direction DR1 between the data lines $DL_{n+1}$, $DL_{n+2}$, $DL3_{n+m-1}$, and $DL3_{n+m}$ of the second group G2 arranged on the left side and right side. The data line $DL_{2+1}$ disposed on a leftmost side among the data lines $DL_{2+1}$ and $DL_{2n+m}$ of the third group G3 may be the data line $DL_{2n+1}$ of a (2n+1)th column disposed adjacent to, in the first direction DR1, the data line of a (2n)th column included in the second group G2. The data lines $DL_{2n+1}$ and $DL_{2n+m}$ of the third group G3 may be arranged in m columns along to the first direction DR1.

Some or a number of data lines $DL_{3n+m-1}$ and $DL3_{n+m}$ of the data lines DL1, DL2, $DL_{4n+m-1}$, and $DL_{4n+m}$ of the second group G2 disposed on the right side of the display area DA may be arranged in the first direction DR1 from the data line $DL_{2n+m}$ disposed on a rightmost side among the data lines $DL_{2n+1}$ and $DL_{2n+m}$ of the third group G3. A data line disposed closest to the data lines $DL_{2n+1}$ and $DL_{2n+m}$ of the third group G3, among the data lines $DL_{3n+m-1}$ and $DL_{3n+m}$ of the second group G2 disposed on the right side, may be a data line of a (2n+m+1)th column. The data lines $DL_{3n+m-1}$ and $DL_{3n+m}$ of the second group G2 disposed on the right side may include data lines arranged in a (2n+m+1)th column to a (3n+m)th column along to the first direction DR1, and FIG. 2 illustrates, as an example, the data lines $DL_{3n+m-1}$ and $DL_{3n+m}$ arranged in a (3n+m−1)th column and a (3n+m)th column among the data lines of the second group G2 disposed on the right side.

The data lines $DL_{4n+m-1}$ and $DL_{4n+m}$ of the first group G1 disposed on the right side of the display area DA may be arranged in the first direction DR1 from a data line of a (3n+m)th column arranged on a rightmost side among the data lines $DL_{3n+m-1}$ and $DL_{3n+m}$ of the second group G2 disposed on the right side of the display area DA. A data line disposed closest to the data lines of the second group G2, among the data lines $DL_{4n+m-1}$ and $DL4_{n+m}$ of the first group G1 disposed on the right side, may be a data line of a (3n+m+1)th column. The data lines $DL_{4n+m-1}$ and $DL4_{n+m}$ of the first group G1 disposed on the right side may include data lines arranged in a (3n+m+1)th column to a (4n+m)th column along to the first direction DR1, and FIG. 2 illustrates, as an example, the data lines $DL_{4n+m-1}$ and $DL4_{n+m}$ arranged in a (4n+m−1)th column and a (4n+m)th column among the data lines of the first group G1 disposed on the right side.

The data lines of the first group G1 and the data lines of the second group G2 disposed on the left side of the display area DA may be symmetric with the data lines of the first group G1 and the data lines of the second group G2 disposed on the right side of the display area DA with the data lines of the third group G3 therebetween. In an embodiment, the number of the data lines DL1, DL2, DL$4_{n+m-1}$, and DL$4_{n+m}$ of the first group G1 may be equal to the number of the data lines DL$_{n+1}$, DL$_{n+2}$, DL$_{3n+m-1}$, and DL$_{3n+m}$ of the second group G2. Herein, descriptions are provided on the basis of the first group G1 and the second group G2 each including data lines arranged in 2n columns. However, the number of data lines included in each group is not limited thereto, and may be designed differently.

In an embodiment, the data lines DL$_{2+1}$ and DL$_{2n+m}$ of the third group G3 may not be provided. In the case where the data lines DL$_{2+1}$ and DL$_{2n+m}$ of the third group G3 is not provided, m may correspond to 0. The data lines DL may be divided into the first group G1 and the second group G2. Therefore, in an embodiment, the data lines of the first group G1 may be arranged in directions from left and right boundaries of the display area DA to the center portion of the display area DA, and the data lines of the first group G1 disposed on the left side of the display area DA may be spaced apart from the data lines of the first group G1 disposed on the right side of the display area DA with the data lines of the second group G2 therebetween.

The connection lines DCL may be disposed in the non-display area NDA and may extend in the second direction DR2. The connection lines DCL may be disposed in an area between the data driver DDV and the display area DA. One ends or ends of the connection lines DCL may be connected to the data driver DDV via the non-display area NDA. Each of the connection lines DCL may electrically connect a corresponding data line DL among the data lines DL to the data driver DDV.

The data lines DL1, DL2, DL$_{4n+m-1}$, and DL$_{4n+m}$ of the first group G1 may be electrically connected to the connection lines DCL via the connection patterns CP1, CP2, CP$_{2n-1}$, and CP$_{2n}$ respectively connected to the data lines DL1, DL2, DL$_{4n+m-1}$, and DL$_{4n}+_m$ of the first group G1. Each of the data lines DL$_{n+1}$, DL$_{n+2}$, DL$_{3n+m-1}$, and DL$_{3n+m}$ of the second group G2 and each of the data lines DL$_{2+1}$ and DL$_{2n+m}$ of the third group G3 may be connected to or directly connected to a corresponding connection line DCL among the connection lines DCL.

Each of the connection patterns CP1, CP2, CP$_{2n-1}$, and CP$_{2n}$ may electrically connect the data lines DL1, DL2, DL$4_{n+m-1}$, and DL$4_{n+m}$ of the first group G1, respectively connected thereto, to the connection lines DCL and the data driver DDV. Since the connection patterns CP1, CP2, CP$_{2n-1}$, and CP$_{2n}$ are disposed in the display area DA, a size of a wiring arrangement area required for connecting, to the data driver DDV, the data lines DL1, DL2, DL$_{4n+m-1}$, and DL$_{4n+m}$ of the first group G1 disposed adjacent to the left and right boundaries of the display area DA may be reduce. For example, a size of a lower portion of the non-display area NDA corresponding to an area between the display area DA and the data driver DDV may be reduced, thus reducing an area of a dead space of the display panel DP. Herein, the term "dead space" may be understood as a space which is devoted to accommodating one or more components that, either singularly or plurally, perform an intended function.

The pads PD may be disposed adjacent to a lower end of the non-display area NDA and may be arranged in the first direction DR1. The pads PD may be disposed closer to the lower end of the non-display area NDA than the data driver DDV. The pads PD may be portions connected to the above-mentioned circuit board MB of FIG. 1B. The pads PD may be electrically connected to the data lines DL, the first control line CSL1, and the second control line CSL2, respectively. Although not illustrated, the power supply line of the display panel DP may be electrically connected to a corresponding pad PD among the pads PD.

The first control line CSL1 may be connected to the scan driver SDV. The second control line CSL2 may be connected to the emission driver EDV.

The scan driver SDV may generate scan signals in response to a scan control signal. The scan signals may be applied to the pixels PX through the scan lines SL. The data driver DDV may generate data voltages corresponding to image signals in response to a data control signal. The data voltages may be applied to the pixels PX through the data lines DL. The emission driver EDV may generate emission signals in response to an emission control signal. The emission signals may be applied to the pixels PX through the emission lines EL.

The pixels PX may be provided with the data voltages in response to the scan signals. The pixels PX may display an image by emitting light of luminance corresponding to the data voltages in response to the emission signals. An emission time of the pixels PX may be controlled by the emission signals. Therefore, the display panel DP may output an image through the display area DA by virtue of the pixels PX.

Figure 3:
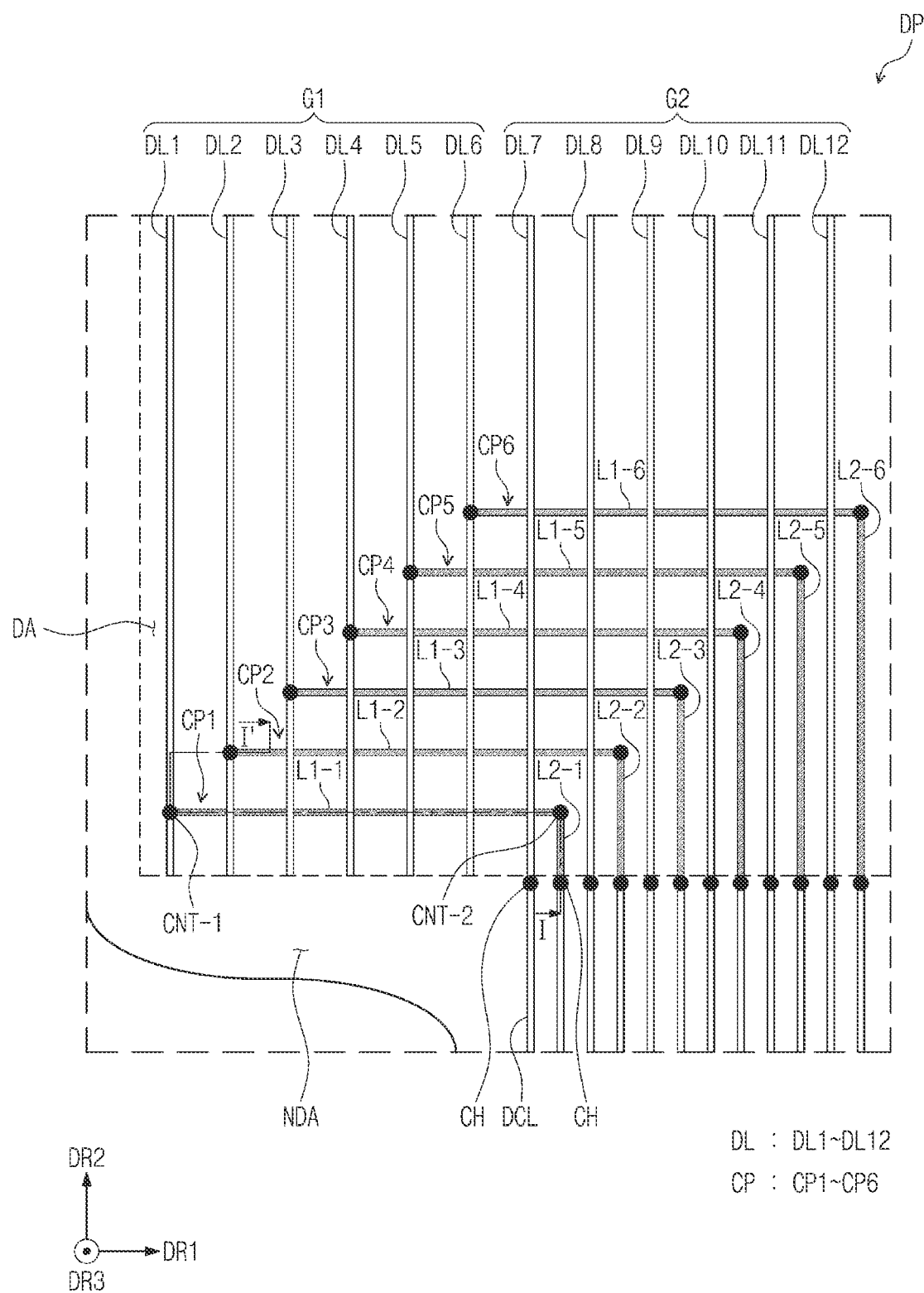
FIG. 3 is an enlarged schematic plan view illustrating a display panel according to an embodiment.

FIG. 3 is an enlarged schematic plan view of a display panel according to an embodiment. FIG. 3 illustrates, as an example, an enlarged schematic plan view of a lower left area of the display panel DP in which connection patterns CP1 to CP6 are disposed. For convenience, FIG. 3 illustrates, as an example, the data lines DL1 to DL6 of the first group G1 arranged in six columns and the data lines DL7 to DL12 of the second group G2 arranged in six columns. However, the number of the data lines of the first group G1 and the second group G2 included in the display panel DP is not limited thereto.

Referring to FIG. 3, the data lines DL may extend in the second direction DR2 and may be arranged in the first direction DR1. The data lines DL1 to DL6 of the first group G1 may be arranged adjacent to an outer boundary of the display area DA. The data lines DL1 to DL6 of the first group G1 may be arranged in the first direction DR1 from the outer boundary of the display area DA. The data lines DL7 to DL12 of the second group G2 may be arranged closer to the center portion of the display area DA than the data lines DL1 to DL6 of the first group G1.

Each of the data lines DL1 to DL6 of the first group G1 may be connected to a corresponding connection pattern among the connection patterns CP. Referring to FIG. 3, the connection patterns CP may include first to sixth connection patterns CP1 to CP6 respectively connected to the data lines DL1 to DL6 of first to sixth columns included in the first group G1.

Each of the data lines DL7 to DL12 of the second group G2 may intersect, in a plan view, at least one of the connection patterns CP. Each of the data lines DL7 to DL12 of the second group G2 may overlap the connection patterns CP in a plan view, and the data lines DL7 to DL12 of the second group G2 may be spaced part from an overlapping connection pattern with an insulating layer therebetween and may be electrically insulated.

Each of the connection patterns CP1 to CP6 may include a first line extending in the first direction DR1 and a second line extending in the second direction DR2. FIG. 3 illustrates reference signs of first lines L1-1, L1-2, L1-3, L1-4, L1-5, and L1-6 and second lines L2-1, L2-2, L2-3, L2-4, L2-5, and L2-6 of the first to sixth connection patterns CP1 to CP6.

Each of the first lines L1-1 to L1-6 of the connection patterns CP1 to CP6 may extend in the first direction DR1 and may be disposed so as to overlap the display area DA. One ends or ends of the first lines L1-1 to L1-6 may be connected to the corresponding data lines DL1 to DL6 of the first group G1, respectively. The first lines L1-1 to L1-6 may be disposed on a layer that is different from that of the data lines DL, and may be respectively connected to the data lines DL1 to DL6 of the first group G1 through a corresponding first contact hole CNT-1 among first contact holes CNT-1.

The first lines L1-1 to L1-6 and the data lines DL1 to DL6 of the first group G1 may be connected to each other in the display area DA. Herein, portions at which the first lines L1-1 to L1-6 and the data lines DL1 to DL6 of the first group G1 are connected to each other may be defined as contact portions, wherein the contact portions may be disposed in the display area DA. For example, the contact portions may be disposed in correspondence to the first contact holes CNT-1 overlapping the display area DA. In the case where the connection patterns CP1 to CP6 and the data lines DL1 to DL6 of the first group G1 are connected to each other in the non-display area NDA, each of the connection patterns CP1 to CP6 may require additional lines extending from one ends or ends of the first lines L1-1 to L1-6 to the non-display area NDA. Since portions at which the first lines L1-1 to L1-6 are connected to the data lines DL1 to DL6 overlap the display area DA, an increase in resistance due to additional lines may be prevented. Furthermore, the connection patterns CP1 to CP6 may be connected to the data lines DL1 to DL6 without increasing a size of the non-display area NDA, and a process of forming the connection patterns CP1 to CP6 may be simplified.

The first lines L1-1 to L1-6 of the connection patterns CP1 to CP6 may be spaced apart from each other and arranged in the second direction DR2 in a plan view. The first lines L1-1 to L1-6 may be arranged so that distances between the first lines L1-1 to L1-6 in the second direction DR2 are equal.

The first lines L1-1 to L1-6 of the connection patterns CP1 to CP6 may have substantially the same length as each other in the first direction DR1. A length of each of the first lines L1-1 to L1-6 may affect resistance of the connection patterns CP1 to CP6. For example, as the length of each of the first lines L1-1 to L1-6 increases, a resistance of the connection patterns CP1 to CP6 may increase. Since the first lines L1-1 to L1-6 have the same length as each other, the connection patterns CP1 to CP6 may have substantially the same resistance.

The first lines L1-1 to L1-6 of the connection patterns CP1 to CP6 may have the same line width as each other. Here, the line width of each of the first lines L1-1 to L1-6 may be a width of a line defined in the second direction DR2. The line width of each of the first lines L1-1 to L1-6 may affect resistance of the connection patterns CP1 to CP6. Since the connection patterns CP1 to CP6 include the first lines L1-1 to L1-6 having the same length and the same line width as each other, the connection patterns CP1 to CP6 may have substantially the same resistance.

Since the connection patterns CP1 to CP6 have the same resistance, a resistance difference between the data lines DL1 to DL6 connected to the connection patterns CP1 to CP6 may be reduced, and a phenomenon of data signal delay caused by the resistance difference between data lines may be prevented.

Each of the first lines L1-1 to L1-6 of the connection patterns CP1 to CP6 may intersect and overlap some or a number of the data lines DL in a plan view. For example, referring to FIG. 3, the first line L1-1 of the first connection pattern CP1 may overlap, in a plan view, the data lines DL2 to DL6 of second to sixth columns included in the first group G1 and the data line DL7 of a seventh column included in the second group G2.

The numbers of the data lines DL overlapping each of the first lines L1-1 to L1-6 may be the same. For example, the first line L1-1 of the first connection pattern CP1 may overlap, in a plan view, six data lines DL2 to DL7 except for the data line DL1 of a first column electrically connected to the first line L1-1 of the first connection pattern CP1, and the first line L1-2 of the second connection pattern CP2 may overlap, in a plan view, six data lines DL3 to DL8 except for the data line DL2 of a second column electrically connected to the first line L1-2 of the second connection pattern CP2. A capacitance may be formed between the first lines L1-1 to L1-6 and the data lines DL overlapping the first lines L1-1 to L1-6, and the number of data lines DL overlapping each of the first lines L1-1 to L1-6 may affect a magnitude of the capacitance.

Since each of the first lines L1-1 to L1-6 of the connection patterns CP1 to CP6 overlaps the same number of data lines DL, a capacitance difference between the connection patterns CP1 to CP6 may be reduced. Accordingly, a phenomenon of data signal delay caused by the capacitance difference may be prevented.

Each of the second lines L2-1 to L2-6 of the connection patterns CP1 to CP6 may extend in the second direction DR2 and may be disposed so as to overlap the display area DA. One ends or ends of the second lines L2-1 to L2-6 may be respectively connected to the first lines L1-1 to L1-6. The second lines L2-1 to L2-6 may be disposed on a layer that is different from that of the first lines L1-1 to L1-6, and may be respectively connected to the first lines L1-1 to L1-6 through a second contact hole CNT-2. However, an embodiment is not limited thereto, and the second lines L2-1 to L2-6 may be disposed on a same layer as the first lines L1-1 to L1-6 and may be connected thereto, forming a shape of one piece.

The second lines L2-1 to L2-6 of the connection patterns CP1 to CP6 may be spaced apart from each other and arranged in the first direction DR1. The second lines L2-1 to L2-6 may be arranged so that distances between the second lines L2-1 to L2-6 in the first direction DR2 are equal.

The second lines L2-1 to L2-6 may be disposed on a same layer as the data lines DL. The second lines L2-1 to L2-6 may be formed simultaneously through a same process as that for forming the data lines DL, thus simplifying a process of forming the connection patterns CP1 to CP6.

The second lines L2-1 to L2-6 may be spaced apart from the data lines DL in the first direction DR1. The second lines L2-1 to L2-6 and the data lines DL may be alternately arranged in the first direction DR1. Since the second lines L2-1 to L2-6 are spaced apart from the data lines DL in a plan view, generation of a subsidiary capacitance that may be formed in case that the second lines L2-1 to L2-6 and the data lines DL overlap each other in a plan view may be prevented.

The second lines L2-1 to L2-6 of the connection patterns CP1 to CP6 may have different lengths as each other in the second direction DR2. For example, a length of the second line L2-1 of the first connection pattern CP1 may be different from a length of the second line L2-2 of the second connection pattern CP2. The second line L2-1 of the first connection pattern CP1 disposed closest to the outer boundary of the display area DA among the first to sixth connection patterns CP1 to CP6 may have a shortest length, and the second line L2-6 of the sixth connection pattern CP6 disposed closer to the center portion of the display area DA among the first to sixth connection patterns CP1 to CP6 may have a longest length.

Other ends of the second lines L2-1 to L2-6 may be disposed in the non-display area NDA, may be connected to the connection lines DCL extending in the second direction DR2, respectively, and may be electrically connected to the data driver DDV (see FIG. 2) through the connection lines DCL. The connection lines DCL may be disposed on a layer that is different from that of the second lines L2-1 to L2-6, and may be connected to the corresponding second lines L2-1 to L2-6 through a contact hole CH. However, an embodiment is not limited thereto, and the connection lines DCL may be disposed on a same layer as the second lines L2-1 to L2-6 and may be connected thereto, forming a shape of one piece.

One ends or ends of the data lines DL7 to DL12 of the second group G2 may be connected to or directly connected to the connection lines DCL, respectively. The connection lines DCL may be disposed on a layer that is different from that of the data lines DL7 to DL12 of the second group G2, and may be connected to a corresponding data line among the data lines DL7 to DL12 of the second group G2 through the contact hole CH. However, an embodiment is not limited thereto, and the connection lines DCL may be disposed on a same layer as the data lines DL and may be connected thereto, forming a shape of one piece.

Figure 4A:
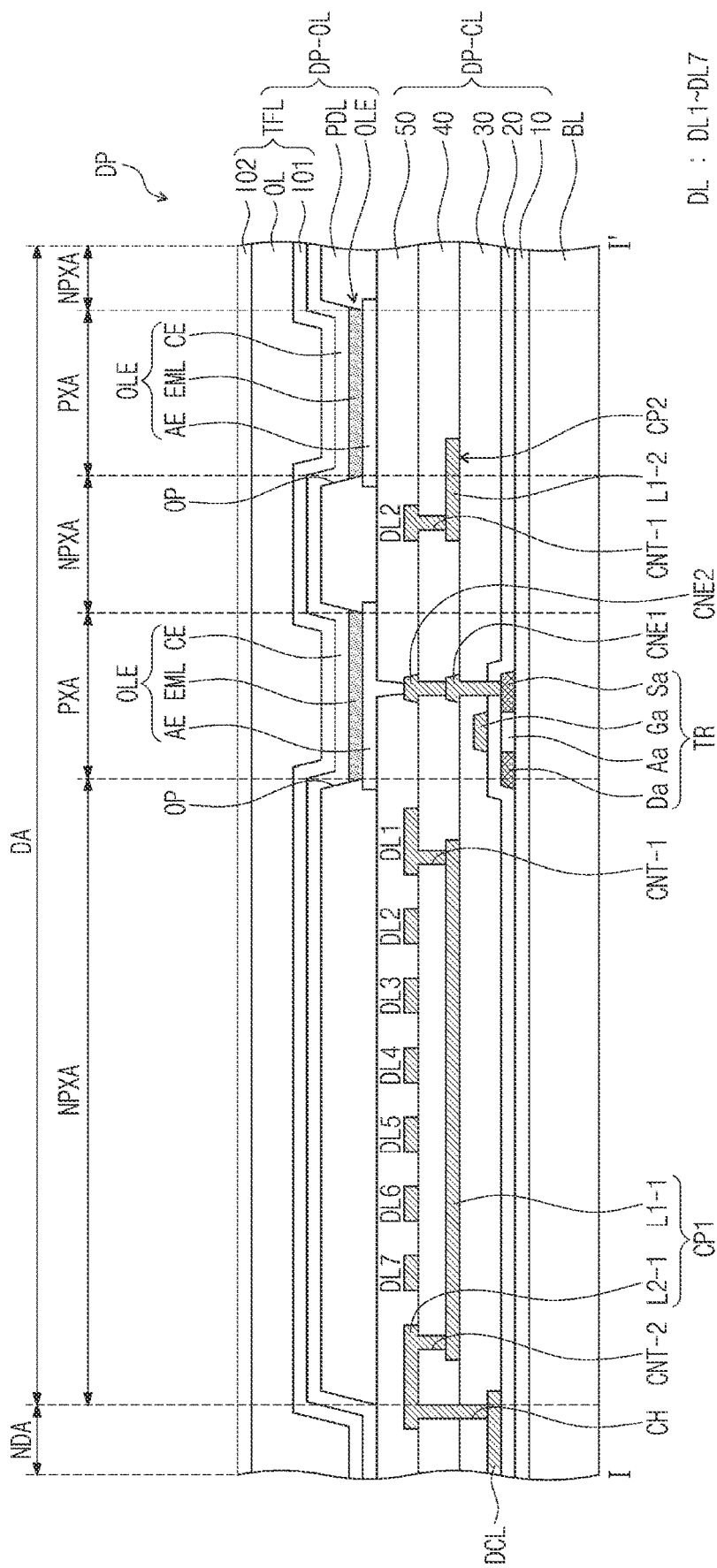
FIGS. 4A and 4B are schematic cross-sectional views illustrating a display panel according to an embodiment.
Figure 4B:
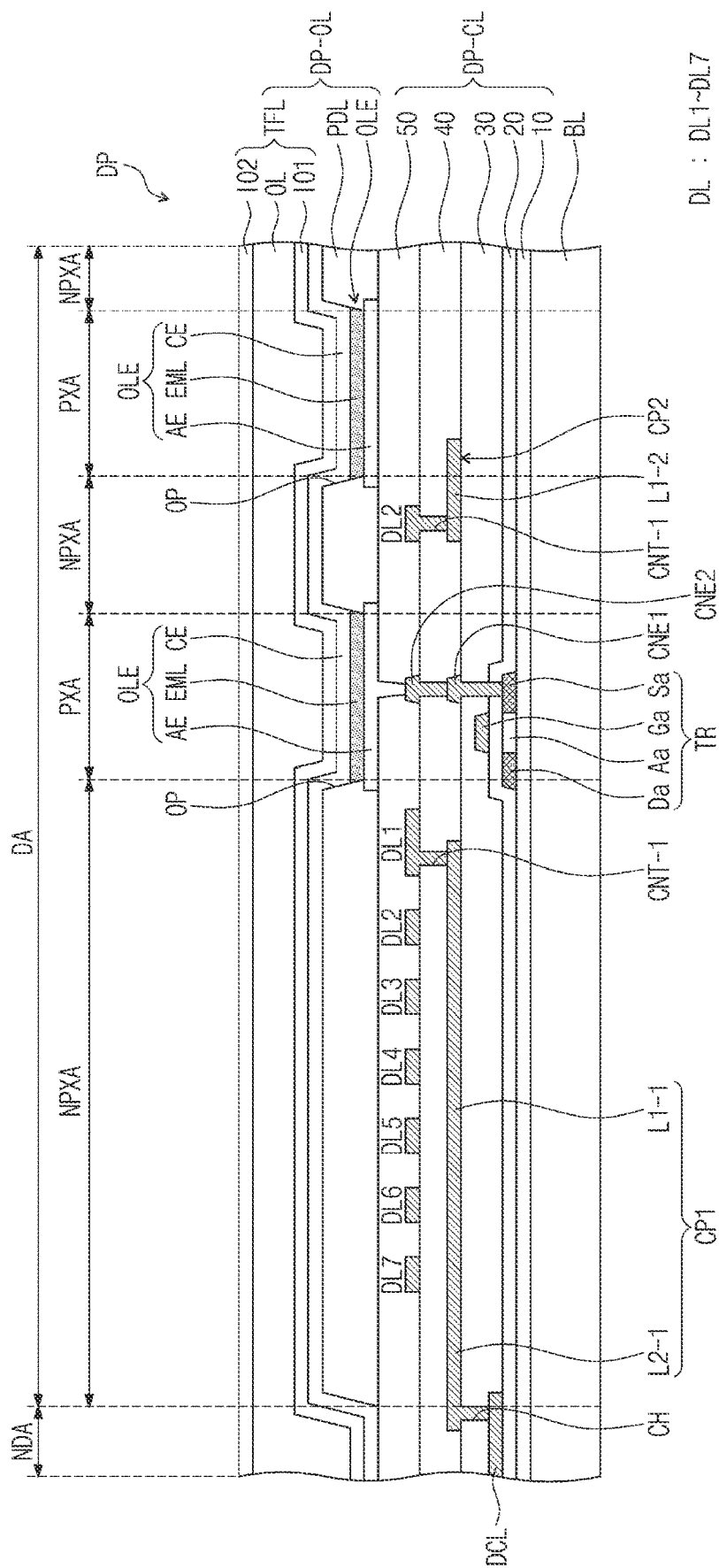

FIGS. 4A and 4B are schematic cross-sectional views illustrating a display panel according to an embodiment. FIGS. 4A and 4B correspond to line I-I' of FIG. 3, and illustrate, as an example, cross-sections of one area or an area of the display panel DP in which the first connection pattern CP1, the second connection pattern CP2, and light-emitting elements OLE are disposed. However, the cross-sections of the display panel DP illustrated in FIGS. 4A and 4B are examples, and may be changed according to arrangement of connection patterns and light-emitting elements.

Referring to FIGS. 4A and 4B, the display panel DP may include a base layer BL, a circuit element layer DP-CL, and a display element layer DP-OL, which are sequentially laminated.

The base layer BL may include the display area DA and the non-display area NDA. The base layer BL may provide a base surface on which the circuit element layer DP-CL is disposed.

The base layer BL may include a glass substrate, a metal substrate, a polymer substrate, or an organic/inorganic composite material substrate. In an embodiment, the base layer BL may include a synthetic resin layer. For example, the synthetic resin layer of the base layer BL may include at least one of acrylate-based resin, methacrylate-based resin, polyisoprene-based resin, vinyl-based resin, epoxy-based resin, urethane-based resin, cellulose-based resin, siloxane-based resin, polyamide-based resin, perylene-based resin, or polyimide-based resin. However, a material of the base layer BL is not limited to the above example.

The circuit element layer DP-CL may be disposed on the base layer BL. The circuit element layer DP-CL may include at least one insulating layer, conductive pattern, and semiconductor pattern. While manufacturing the display panel DP, an insulating layer, a semiconductor layer, and a conductive layer may be formed on the base layer BL by coating, deposition, or the like within the spirit and the scope of the disclosure. Thereafter, the insulating layer, the semiconductor layer, and the conductive layer may be selectively patterned through photolithography. Through this process, the semiconductor pattern, conductive pattern, and signal lines included in the circuit element layer DP-CL may be formed. The cross-sections of the circuit element layer DP-CL illustrated in FIGS. 4A and 4B are examples, and a laminate structure of the circuit element layer DP-CL may be variously changed according to a process procedure, a process method, or configuration of elements included in pixels.

Each pixel may have an equivalent circuit including transistors, at least one capacitor and a light-emitting element, and the equivalent circuit of the pixel may be modified into various forms. The semiconductor pattern may be arranged over pixels according to the equivalent circuit and a prescribed rule. FIGS. 4A and 4B illustrate, as an example, one transistor TR and the light-emitting element OLE.

The circuit element layer DP-CL may include the transistor TR, connection electrodes CNE1 and CNE2, and insulating layers 10 to 50. The circuit element layer DP-CL may include the above-mentioned signal lines, and FIGS. 4A and 4B illustrate, as an example, the data lines DL1 to DL7, the first connection pattern CP1, the second connection pattern CP2, and the connection line DCL, included in the circuit element layer DP-CL.

In an embodiment, the insulating layers 10 to 50 may include first to fifth insulating layers 10 to 50. The first to fifth insulating layers 10 to 50 may be disposed on the base layer BL. Each of the first to fifth insulating layers 10 to 50 may include an organic layer or an inorganic layer. The inorganic layer may include at least one of aluminum oxide, titanium oxide, silicon oxide, silicon nitride, silicon oxynitride, zirconium oxide, or hafnium oxide, but is not limited thereto. The organic layer may include a phenol-based polymer, acryl-based polymer, imide-based polymer, aryl ether-based polymer, amide-based polymer, fluorine-based polymer, p-xylene-based polymer, vinyl alcohol-based polymer, and combinations thereof, but is not limited thereto.

The first insulating layer 10 may be disposed on the base layer BL. The first insulating layer 10 may include an inorganic layer, and may be provided as a buffer layer and/or barrier layer on the base layer BL. The buffer layer may enhance a bonding strength between the base layer BL and the semiconductor pattern or conductive pattern. The barrier layer may prevent foreign material from flowing from the outside to the semiconductor pattern and the conductive pattern.

The semiconductor pattern of the transistor TR may be disposed on the first insulating layer 10. The semiconductor pattern may include polysilicon. However, an embodiment is not limited thereto, and the semiconductor pattern may include amorphous silicon, crystalline oxide, or non-crystalline oxide.

A source area Sa, a drain area Da, and a channel area Aa of the transistor TR may be formed from the semiconductor pattern. The semiconductor pattern may be divided into areas according to conductivity. For example, the semiconductor pattern may have different electric properties according to whether the semiconductor pattern is doped or whether reduction of metal oxide occurs. An area having high conductivity in the semiconductor pattern may serve as an electrode or a signal line, which may correspond to the source area Sa and the drain area Da of the transistor TR. An area having relatively low conductivity without being doped or reduced may correspond to the channel area Aa (or active area) of the transistor TR.

The second insulating layer 20 may be disposed on the first insulating layer 10, covering or overlapping the semiconductor pattern of the transistor TR. A gate electrode Ga may be disposed on the second insulating layer 20. The gate electrode Ga may overlap the channel area Aa. In a schematic cross-sectional view, the gate electrode Ga may be spaced apart from the semiconductor pattern of the transistor TR with the second insulating layer 20 therebetween. In an embodiment, the gate electrode Ga may function as a mask during a process of doping the semiconductor pattern.

The third insulating layer 30 may be disposed on the second insulating layer 20 so as to cover or overlap the gate electrode Ga. The first connection electrode CNE1 may be disposed on the third insulating layer 30. The first connection electrode CNE1 may be connected to the source area Sa of the transistor TR through a channel hole penetrating the second and third insulating layers 20 and 30.

The fourth insulating layer 40 may be disposed on the third insulating layer 30 so as to cover or overlap the first connection electrode CNE1. The second connection electrode CNE2 may be disposed on the fourth insulating layer 40. The second connection electrode CNE2 may be connected to the first connection electrode CNE1 through a channel hole penetrating the fourth insulating layer 40.

The fifth insulating layer 50 may be disposed on the fourth insulating layer 40 so as to cover or overlap the second connection electrode CNE2. The fifth insulating layer 50 may have defined therein a channel hole exposing a portion of the second connection electrode CNE2, and the second connection electrode CNE2 may be connected to a pixel electrode AE of the light-emitting element OLE through this channel hole. Therefore, the first connection electrode CNE1 and the second connection electrode CNE2 may electrically connect the source area Sa of the transistor TR to the pixel electrode AE.

Referring to FIG. 4A, the first connection pattern CP1 and the second connection pattern CP2 may be disposed within the display area DA. FIG. 4A illustrates, as an example, the first connection pattern CP1 overlapping a non-emission area NPXA of the display area DA and the second connection pattern CP2 partially overlapping an emission area PXA of the display area DA. However, arrangement of the pixel electrode AE included in the display panel DP may be variously changed according to embodiments, and at least portion of the connection patterns CP (see FIG. 3) may overlap the emission area PXA. As long as the connection patterns CP (see FIG. 3) are connected to corresponding data lines DL in the display area DA, an embodiment is not limited thereto.

In an embodiment, the first line L1-1 of the first connection pattern CP1 may be disposed on the third insulating layer 30. The first line L1-2 of the second connection pattern CP2 may be disposed on the third insulating layer 30 that is the same layer as that on which the first line L1-1 of the first connection pattern CP1 is disposed. The first line L1-1 of the first connection pattern CP1 and the first line L1-2 of the second connection pattern CP2 may be disposed on a same layer as that of the first connection electrode CNE1 and may be formed through a same process. The fourth insulating layer 40 may be disposed on the first lines L1-1 and L1-2 and may have formed therein the first and second contact holes CNT-1 and CNT-2 exposing portions of the first lines L1-1 and L1-2\.

The second line L2-1 of the first connection pattern CP1 may be disposed on the fourth insulating layer 40. The second line L2-1 may be disposed on a same layer as that of the second connection electrode CNE2, and may be formed through a same process. Although not illustrated in FIG. 4A, the second line L2-2 (see FIG. 3) of the second connection pattern CP2 may also be disposed on the fourth insulating layer 40 that is a same layer as that on which the second line L2-1 of the first connection pattern CP1 is disposed. The first and second connection patterns CP1 and CP2 may be formed during a process of forming driving elements included in the circuit element layer DP-CL without adding a process procedure or a conductive layer. In this manner, a forming process of the first and second connection patterns CP1 and CP2 may be simplified.

The data lines DL may be disposed on the fourth insulating layer 40. The data lines DL may be disposed on a same layer as that of the second line L2-1 of the first connection pattern CP1. The data line DL may be arranged in one direction or a direction on the fourth insulating layer 40.

The data line DL1 of a first column among the data lines DL may be connected to the first connection pattern CP1. The data line DL1 of a first column may be connected to the first line L1-1 of the first connection pattern CP1 through the first contact hole CNT-1. The second line L2-1 of the first connection pattern CP1 may be connected to the first line L1-1 through the second contact hole CNT-2.

The data line DL2 of a second column among the data lines DL may be connected to the second connection pattern CP2. The data line DL2 of a second column may be connected to the first line L1-2 of the second connection pattern CP2 through the first contact hole CNT-1.

The first line L1-1 of the first connection pattern CP1 may overlap portion of the data lines DL. Referring to FIG. 4A, the first line L1-1 of the first connection pattern CP1 may overlap the data line DL2 of a second column to the data line DL7 of a seventh column. For example, the first line L1-1 of the first connection pattern CP1 may overlap the data lines DL2 to DL7 of six columns except for the data line DL1 of a first column connected to the first line L1-1 of the first connection pattern CP1, and the number of data lines overlapping the first line L1-1 may affect capacitance formed due to a connection pattern.

Since the first lines of connection patterns according to an embodiment are formed so that the numbers of data lines overlapping each of the first lines are equal, the resistances and capacitances of the connection patterns may be substantially the same. In this manner, differences of resistance and capacitance between data lines connected to connection patterns may be minimized. Accordingly, degradation of display quality due to differences of resistance and capacitance may be prevented.

The first line L1-1 of the first connection pattern CP1 may be disposed on an upper layer than the data lines DL, without being limited to the embodiment illustrated in FIG. 4A. For example, in an embodiment, the data lines DL and the second line L2-1 of the first connection pattern CP1 may be disposed on the third insulating layer 30, and the first line L1-1 of the first connection pattern CP1 may be disposed on the fourth insulating layer 40.

The connection line DCL disposed in the non-display area NDA may be disposed on the second insulating layer 20. The connection line DCL may be disposed on a same layer as that of the gate electrode Ga. The connection line DCL may be connected to the second line L2-1 of the first connection pattern CP1 through the contact hole CH penetrating the third and fourth insulating layers 30 and 40. The connection line DCL may receive a data signal by being connected to the data driver DDV (see FIG. 2), and the data signal may be transferred to the data line DL1 of a first column through the first connection pattern CP1. However, an embodiment is not limited thereto, and the connection line DCL may be disposed on a same layer as that of the second line L2-1 and connected thereto so as to be integral and connected to each other.

The embodiment of the display panel DP illustrated in FIG. 4B may include substantially the same configuration as the embodiment of FIG. 4A, and may be different from the embodiment of FIG. 4A with respect to a partial configuration of the first connection pattern CP1. Referring to FIG. 4B, the first line L1-1 and the second line L2-1 of the first connection pattern CP1 may be formed on a same layer. In an embodiment, the first line L1-1 and the second line L2-1 of the first connection pattern CP1 may be disposed on the third insulating layer 30, and the first line L1-1 and the second line L2-1 may be integral and connected to each other.

Although the connection patterns have been described on the basis of the first connection pattern CP1 illustrated in FIGS. 4A and 4B, the above descriptions may also be applied to other connection patterns.

Referring to FIGS. 4A and 4B, the display element layer DP-OL may be disposed on the circuit element layer DP-CL. The display element layer DP-OL may include the light-emitting elements OLE, a pixel defining layer PDL, and an encapsulation layer TFL.

The display area DA may include the emission area PXA corresponding to the light-emitting element OLE and the non-emission area NPXA surrounding the emission area PXA. The light-emitting element OLE may be provided in plural, and the display area DA may include the emission areas PXA corresponding to the light-emitting elements OLE. The non-emission area NPXA may surround the emission areas PXA.

The light-emitting element OLE may include the pixel electrode AE, an emission layer EML, and a common electrode CE. The pixel electrode AE may be disposed on the fifth insulating layer 50. The pixel defining layer PDL may be disposed on the pixel electrode AE and the fifth insulating layer 50, and may have defined therein an opening OP exposing a portion of the pixel electrode AE. The portion of the pixel electrode AE exposed by the opening OP of the pixel defining layer PDL may correspond to the emission area PXA.

The pixel defining layer PDL may include an organic material. The pixel defining layer PDL of an embodiment may have a color. For example, the pixel defining layer PDL may include a base resin and a black pigment and/or black dye mixed with the base resin. However, an embodiment of the pixel defining layer PDL is not limited thereto.

The emission layer EML may be disposed on the pixel electrode AE. The emission layer EML may be disposed in an area corresponding to the opening OP of the pixel defining layer PDL. The emission layer EML may include an organic light-emitting material, an inorganic light-emitting material, quantum dots, or quantum rods. The emission layer EML may be separately formed in each pixel. However, an embodiment is not limited thereto, and the emission layer EML may be commonly formed in pixels, and may generate a first light that is a source light.

In an embodiment, the light-emitting element OLE may be a light-emitting element having a tandem structure including emission layers. The emission layers may be laminated on the pixel electrode AE in a thickness direction. The emission layers may generate light of a same color, or some or a number of the emission layers may generate light of a different color from that of the other emission layers. The light-emitting element having the tandem structure may further include functional layers such as a hole control layer, an electron control layer, and a charge generation layer, disposed between the emission layers.

The common electrode CE may be disposed on the emission layer EML. The common electrode CE may be commonly disposed in pixels. The common electrode CE may overlap the emission area PXA and the non-emission area NPXA. A common voltage may be provided to the common electrode CE.

The light-emitting element OLE may further include emission functional layers disposed between the pixel electrode AE and the common electrode CE. For example, the light-emitting element OLE may include a hole transport layer or hole injection layer disposed between the pixel electrode AE and the emission layer EML, and may include an electron transport layer or electron injection layer disposed between the emission layer EML and the common electrode CE.

A first voltage may be applied to the pixel electrode AE through the transistor TR, and a common voltage may be applied to the common electrode CE. Holes and electrons injected to the emission layer EML may combine with each other to form an exciton, and the light-emitting element OLE may output light through the emission area PXA as the exciton transitions to a ground state.

The encapsulation layer TFL may be disposed on the light-emitting element OLE and the pixel defining layer PDL so as to seal the light-emitting element OLE. In an embodiment, the encapsulation layer TFL may include first and second inorganic layers IO1 and IO2 and an organic layer OL disposed between the first and second inorganic layers IO1 and IO2. However, a laminate structure of the encapsulation layer TFL is not limited thereto.

The first and second inorganic layers IO1 and IO2 may protect the light-emitting element OLE from moisture and/or oxygen. For example, the first and second inorganic layers IO1 and IO2 may include at least one of aluminum oxide, titanium oxide, silicon oxide, silicon nitride, silicon oxynitride, zirconium oxide, or hafnium oxide, but is not limited thereto.

The organic layer OL may protect the light-emitting element OLE from foreign material such as dust particles. For example, the organic layer OL may include an acryl-based resin, but is not limited thereto.

Figure 5:
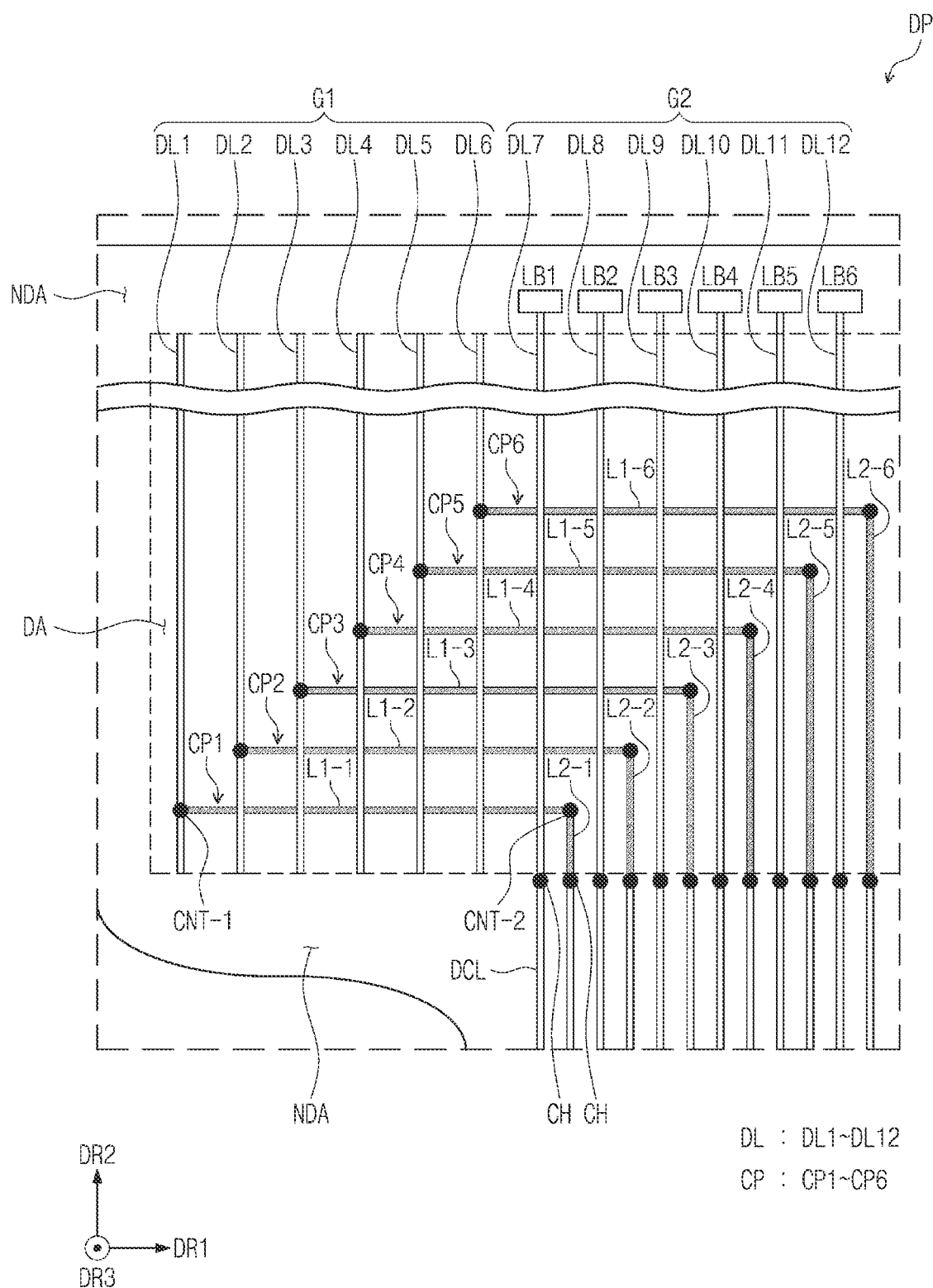
FIG. 5 is an enlarged schematic plan view illustrating a display panel according to an embodiment.
Figure 6A:
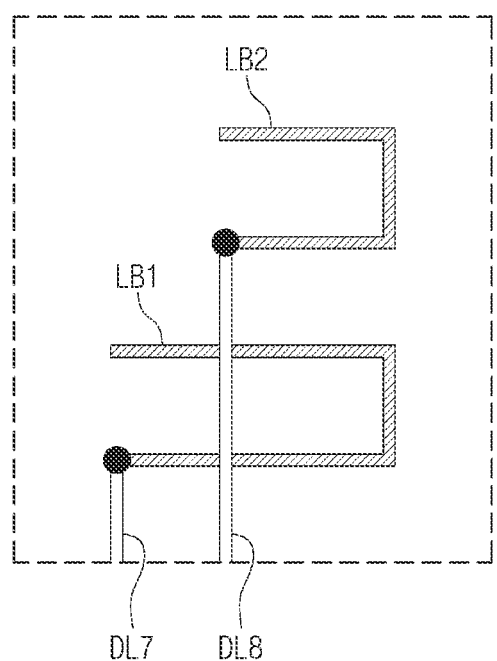
FIGS. 6A and 6B are schematic plan views illustrating load blocks according to an embodiment.
Figure 6B:
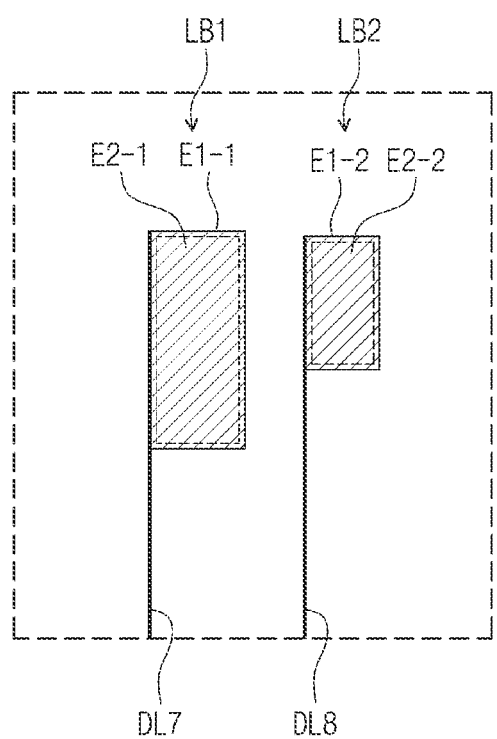

FIG. 5 is an enlarged schematic plan view of a display panel according to an embodiment. FIGS. 6A and 6B are schematic plan views of load blocks according to an embodiment. The display panel DP of FIG. 5 may include substantially the same configuration as the display panel DP of FIG. 3, and may partially differ in configuration from the display panel DP of FIG. 3. The following descriptions are focused on differences.

The display panel DP of an embodiment may include a load block connected to at least one of the data lines DL7 to DL12 of the second group G2. FIG. 5 illustrates, as an example, first to sixth load blocks LB1 to LB6 respectively connected to the data lines DL7 to DL12 of the second group G2. The load blocks LB1 to LB6 may have a load magnitude. However, an embodiment is not limited thereto, and a portion of the load blocks LB1 to LB6 may have a load magnitude of 0. A portion of the first to sixth load blocks LB1 to LB6 respectively connected to the data lines DL7 to DL12 of the second group G2 may be omitted. An omitted load block may correspond to a load block having a load magnitude of 0.

The load blocks LB1 to LB6 may include configurations for controlling resistance and/or capacitance of the data lines DL7 to DL12 of the second group G2. For example, each of the load blocks LB1 to LB6 may be provided as a capacitor connected to a data line, or may be provided as a resistance compensation pattern connected to a data line and having a form of a line. The load blocks LB1 to LB6 all may be provided as a capacitor or all may be provided as a resistance compensation pattern, but an embodiment is not limited thereto, and a portion of the load blocks LB1 to LB6 may be provided as a capacitor and another portion may be provided as a resistance compensation pattern.

Referring to FIG. 5, the data line DL7 of a seventh column among the data lines DL7 to DL12 of the second group G2 may be disposed closest to the data lines DL1 to DL6 of the first group G1 in the first direction DR1. The data lines DL7 to DL12 of seventh to 12th columns included in the second group G2 may be arranged in the first direction DR1. Therefore, the data line DL12 of a 12th column among the data lines DL7 to DL12 of the second group G2 may be arranged farthest from the data lines DL1 to DL6 of the first group G1.

At least two load blocks among the first to sixth load blocks LB1 to LB6 may have different load magnitudes as each other. For example, at least a portion of the first to sixth load blocks LB1 to LB6 may differ in a resistance and/or capacitance. For example, the data lines DL7 to DL12 of the second group G2 may be arranged spaced apart farther from the data lines DL1 to DL6 of the first group G1 in a direction from the data line DL7 of a seventh column to the data line DL12 of a 12th column, and resistance and/or capacitance of the first to sixth load blocks LB1 to LB6 connected to corresponding data lines among the data lines DL7 to DL12 of the second group G2 may sequentially reduce. The resistance and/or capacitance of the first load block LB1, among the first to sixth load blocks LB1 to LB6, connected to the data line DL7 of a seventh column disposed closest to the data lines DL1 to DL6 of the first group G1 may be largest, and the resistance and/or capacitance of the sixth load block LB6, among the first to sixth load blocks LB1 to LB6, connected to the data line DL12 of a 12th column disposed spaced apart farthest from the data lines DL1 to DL6 of the first group G1 may be smallest.

However, an embodiment is not limited thereto, and portions of the first to sixth load blocks LB1 to LB6 may have the same resistance and/or capacitance. In detail, load blocks respectively connected to data lines that are adjacent to each other in the first direction DR1 among the data lines DL7 to DL12 of the second group G2 may have the same resistance and/or capacitance.

The first to sixth load blocks LB1 to LB6 may be connected to the data lines of the second group G2 so as to gradually reduce a resistance and/or capacitance difference with the data lines of the first group G1 connected to the connection patterns CP. For example, the resistance and/or capacitance of the first load block LB1 may be substantially the same as or similar to the resistance and/or capacitance of the sixth connection pattern CP6 connected to the data line DL6 of a sixth column among the data lines of the first group G1 adjacent to the data line DL7 of a seventh column.

Load values of the first to sixth load blocks LB1 to LB6 may gradually reduce so as not to increase a resistance and/or capacitance difference between the data lines of the second group G2. For example, the resistance and/or capacitance of the second load block LB2 connected to the data line DL8 of an eighth column adjacent to the data line DL7 of a seventh column among the data lines of the second group G2 may be smaller than or substantially the same as the resistance and/or capacitance of the first load block LB1. The resistance and/or capacitance of the sixth load block LB6 connected to the data line DL12 of a 12th column may be smallest among the resistances and/or capacitances of the first to sixth load blocks LB1 to LB6. For example, the resistance value or capacitance value of the sixth load block LB6 may be substantially 0 or close to 0.

FIG. 6A is a schematic plan view illustrating the first and second load blocks LB1 and LB2 provided in a form of a resistance compensation pattern. Each of the first and second load blocks LB1 and LB2 provided as a resistance compensation pattern may be connected to a corresponding data line and may have a form of a line. Referring to FIG. 6A, the first and second load blocks LB1 and LB2 of an embodiment, provided as a resistance compensation pattern, may have a curved form shaped like "U" in a plan view.

The first load block LB1 having a structure of a resistance compensation pattern may be referred to as a first resistance compensation pattern, and the second load block LB2 having a structure of a resistance compensation pattern may be referred to as a second resistance compensation pattern. The first resistance compensation pattern may be connected to the data line DL7 of a seventh column, and the second resistance compensation pattern may be connected to the data line DL8 of an eighth column.

The load magnitude of the first load block LB1 may be larger than the load magnitude of the second load block LB2. For example, the magnitude of resistance of the first load block LB1 provided as a resistance compensation pattern (for example, a resistance of the first resistance compensation pattern) may be larger than the magnitude of resistance of the second load block LB2 (for example, a resistance of the second resistance compensation pattern). A length of the resistance compensation pattern may affect a resistance of the resistance compensation pattern. Therefore, the length of the first resistance compensation pattern may be larger than the length of the second resistance compensation pattern.

The load blocks LB1 to LB6 provided in a form of a resistance compensation pattern may be connected to corresponding data lines, respectively, in the display area DA. However, an embodiment is not limited thereto, and the load blocks LB1 to LB6 provided in a form of a resistance compensation pattern may be connected to corresponding data lines, respectively, in the non-display area NDA. An embodiment of a resistance compensation pattern disposed in the display area DA will be described in detail with reference to FIGS. 7A, 7B, and 8.

FIG. 6B is a schematic plan view illustrating the first and second load blocks LB1 and LB2 provided in a form of a capacitor. Referring to FIG. 6B, each of the first and second load blocks LB1 and LB2 having a form of a capacitor may be connected to a corresponding data line, and may include electrodes having a planar area size. Each of the first load block LB1 and the second load block LB2 may include first electrode E1-1 and E1-2 and second electrode E2-1 and E2-2 overlapping each other in a plan view.

The load magnitude of the first load block LB1 may be larger than the load magnitude of the second load block LB2. Therefore, a capacitance of the first load block LB1 provided as a capacitor (for example, a capacitance of a first capacitor) may be larger than a capacitance of the second load block LB2 provided as a capacitor (for example, a capacitance of a second capacitor). The planar area size of the electrodes may affect the capacitance of the capacitors. The planar area sizes of the first and second electrodes E1-1 and E2-1 of the first load block LB1 may be larger than the planar area sizes of the first and second electrodes E1-2 and E2-2 of the second load block LB2.

The load blocks LB1 to LB6 provided in a form of a capacitor may be connected to corresponding data lines, respectively, in the display area DA. However, an embodiment is not limited thereto, and the load blocks LB1 to LB6 provided in a form of a capacitor may be connected to corresponding data lines, respectively in the non-display area NDA. An embodiment of a capacitor disposed in the non-display area NDA will be described in detail with reference to FIG. 9.

The first to sixth load blocks LB1 to LB6 may reduce a resistance and/or capacitance difference between the data lines DL1 to DL6 of the first group G1 and the data lines DL7 to DL12 of the second group G2. Furthermore, the load blocks LB1 to LB6 may reduce a resistance and/or capacitance difference between the data lines DL7 to DL12 of the second group G2. In case that the resistance and/or capacitance of data lines sharply changes between data lines, degradation of display quality such as a stain may occur in the display area DA. The first to sixth load blocks LB1 to LB6 may prevent the degradation of display quality by reducing the resistance and/or capacitance difference between the data lines DL.

Although descriptions are provided on the basis of 12 data lines DL for convenience, the number of data lines DL actually included in the display panel DP may be larger.

Figure 7A:
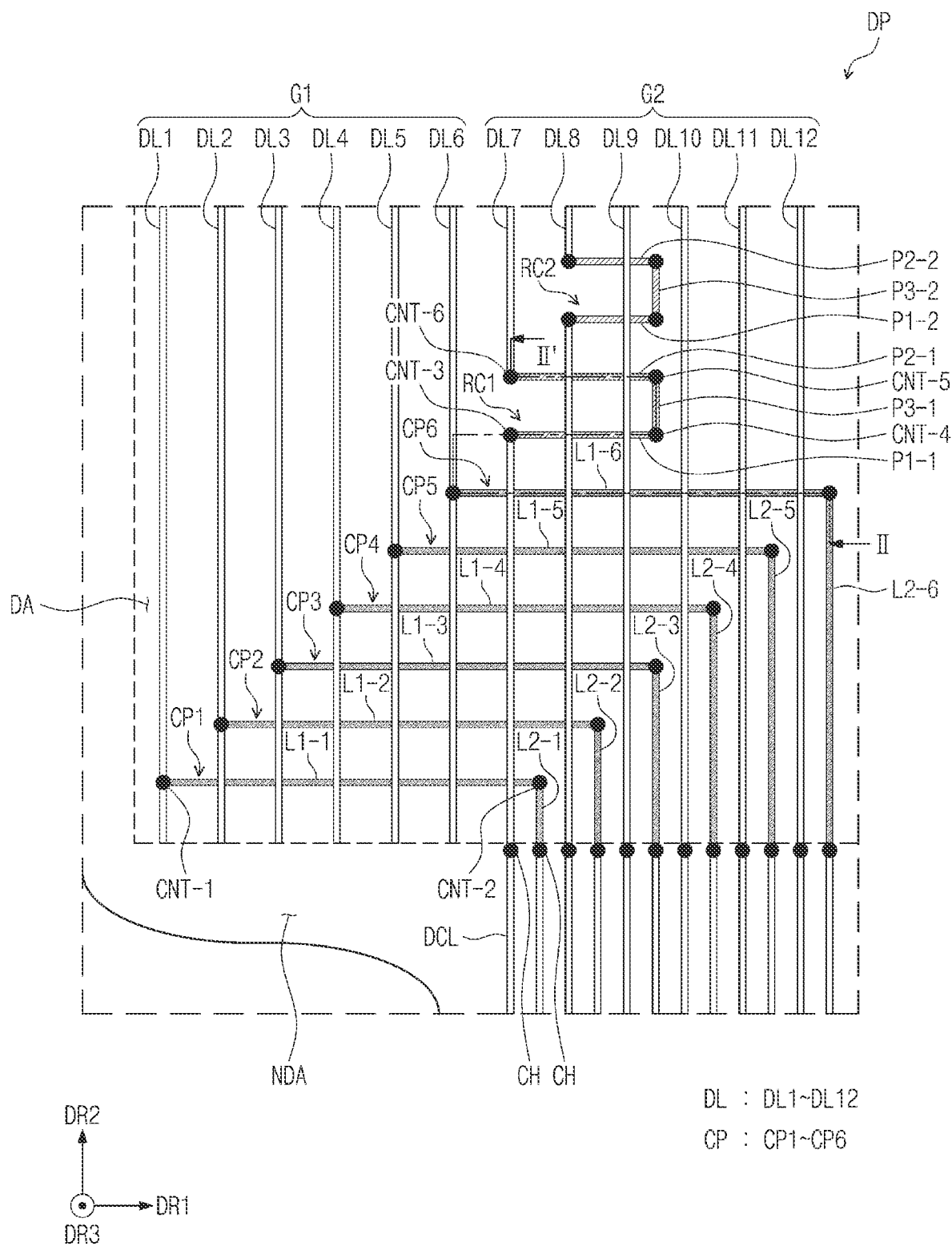
FIGS. 7A and 7B are enlarged schematic plan views illustrating a display panel according to an embodiment.
Figure 7B:
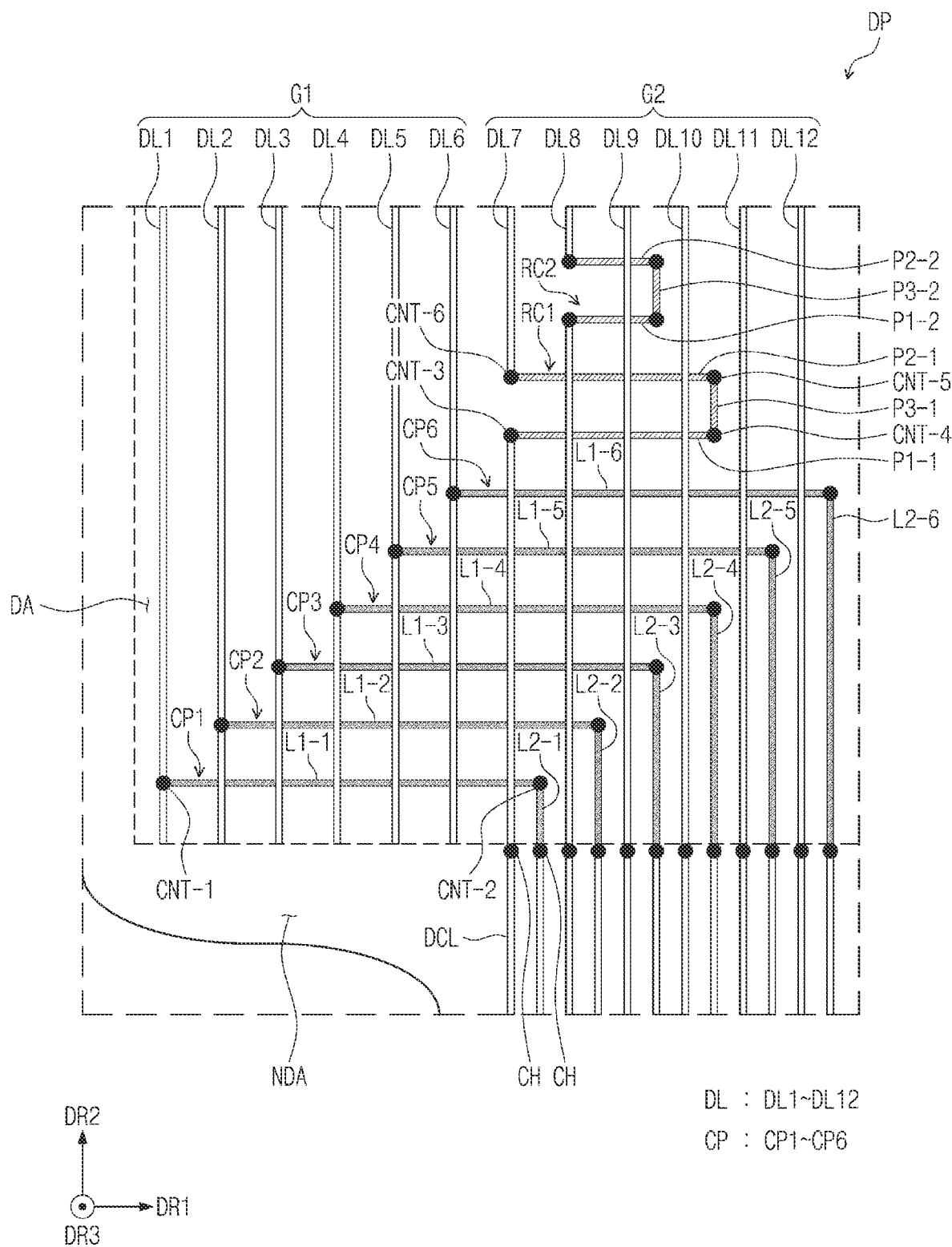

FIGS. 7A and 7B are enlarged schematic plan views of a display panel according to an embodiment. FIGS. 7A and 7B illustrate embodiments of load blocks provided in a form of a resistance compensation pattern. The following descriptions are focused on resistance compensation patterns RC1 and RC2.

A portion of the above-mentioned first to sixth load blocks LB1 to LB6 may be omitted, and FIGS. 7A and 7B illustrate, as an example, the first load block LB1 (see FIG. 5) provided as the first resistance compensation pattern RC1 and a second load block LB2 (see FIG. 5) provided as the second resistance compensation pattern RC2. However, an embodiment is not limited thereto.

The first and second resistance compensation patterns RC1 and RC2 may be disposed in the display area DA. The first resistance compensation pattern RC1 may be connected to the data line DL7 of a seventh column, and the second resistance compensation pattern RC2 may be connected to the data line DL8 of an eighth column.

Each of the first and second resistance compensation patterns RC1 and RC2 may include first portion P1-1 and P1-2 and second portion P2-1 and P2-2 extending in the first direction DR1 and third portion P3-1 and P3-2 extending in the second direction DR2.

In case that the resistance compensation patterns is described with the basis of the first resistance compensation pattern RC1, the first portion P1-1 and the second portion P2-1 of the first resistance compensation pattern RC1 may be spaced apart from each other in the second direction DR2 in a plan view. The third portion P3-1 of the first resistance compensation pattern RC1 may be connected to one end or an end of the first portion P1-1 and one end or an end of the second portion P2-1 so as to connect the first portion P1-1 and the second portion P2-1.

The first portion P1-1 and the second portion P2-1 may be formed on a same layer. The first portion P1-1 and the second portion P2-1 may be formed on a same layer as that of the first lines L1-1 to L1-6 of the connection patterns CP. The first portion P1-1 and the second portion P2-1 may be simultaneously formed through a same process as that of the first lines L1-1 to L1-6 of the connection patterns CP.

The third portion P3-1 may be formed on a layer different from that of the first portion P1-1 and the second portion P2-1. The third portion P3-1 may be formed on a same layer as that of the second lines L2-1 to L2-6 of the connection patterns CP. The third portion P3-1 may be simultaneously formed through a same process as that of the second lines L2-1 to L2-6 of the connection pattern CP. The third portion P3-1 may be disposed on a same layer as the data lines DL.

The resistance compensation patterns RC1 and RC2 may be simultaneously formed with the connection patterns CP during a forming process of the connection patterns CP. Therefore, since the resistance compensation patterns RC1 and RC2 may be formed together with the connection patterns CP during the forming process of the connection patterns CP without adding a process procedure or a conductive layer, a forming process of the resistance compensation patterns RC1 and RC2 may be simplified.

One end or an end of the first portion P1-1 of the first resistance compensation pattern RC1 may be connected to the data line DL7 of a seventh column through a third contact hole CNT-3. The other end or another end of the first portion P1-1 may be connected to one end or an end of the third portion P3-1 through a fourth contact hole CNT-4. One end or an end of the second portion P2-1 may be connected to the other end or another end of the third portion P3-1 through a fifth contact hole CNT-5, and the other end or another end of the second portion P2-1 may be connected to the data line DL7 of a seventh column through a sixth contact hole CNT-6.

A portion of the data line DL7 of a seventh column connected to the first portion P1-1 and a portion of the data line DL7 of a seventh column connected to the second portion P2-1 may be spaced apart from each other and may be electrically connected to each other through the first resistance compensation pattern RC1. Portions of the data line D7 of a seventh column respectively connected to the first portion P1-1 and the second portion P2-1 may be electrically connected to each other through the first resistance compensation pattern RC1 and may be defined as one data line for receiving the same signal.

Although the resistance compensation patterns have been described on the basis of the first resistance compensation pattern RC1 and the data line DL7 of a seventh column, the relevant descriptions may also be applied to the second resistance compensation pattern RC2 and the data line DL8 of an eighth column connected thereto.

The resistance of the first resistance compensation pattern RC1 may be different from the resistance of the second resistance compensation pattern RC2. The resistance of the first resistance compensation pattern RC1 connected to the data line DL7 of a seventh column disposed closer to the data lines DL1 to DL6 of the first group G1 may be larger than the resistance of the second resistance compensation pattern RC2.

Lengths of the first portion P1-1 and the second portion P2-1 of the first resistance compensation pattern RC1 may affect the resistance of the first resistance compensation pattern RC1. A sum of the lengths of the first portion P1-1 and the second portion P2-1 of the first resistance compensation pattern RC1 may be larger than a sum of lengths of the first portion P1-2 and the second portion P2-2 of the second resistance compensation pattern RC2.

The first portion P1-1 and the second portion P2-1 of the first resistance compensation pattern RC1, in a plan view, may be electrically insulated and may overlap a portion of the data lines DL. The number of data lines DL overlapping the first portion P1-1 and the second portion P2-1 of the first resistance compensation pattern RC1 may affect the capacitance of the first resistance compensation pattern RC1. The number of data lines DL overlapping the first portion P1-1 and the second portion P2-1 of the first resistance compensation pattern RC1 may be larger than the number of data lines DL overlapping the first portion P1-2 and the second portion P2-2 of the second resistance compensation pattern RC2. For example, referring to FIG. 7A, each of the first portion P1-1 and the second portion P2-1 of the first resistance compensation pattern RC1 may overlap the data lines DL8 and DL9 of eighth and ninth columns except for the data line DL7 of a seventh column to which the first portion P1-1 and the second portion P2-1 of the first resistance compensation pattern RC1 are electrically connected. Each of the first portion P1-2 and the second portion P2-2 of the second resistance compensation pattern RC2 may overlap the data line DL9 of a ninth column except for the data line DL8 of an eighth column to which the first portion P1-2 and the second portion P2-2 of the second resistance compensation pattern RC2 are electrically connected.

Line widths of the first portion P1-1 and the second portion P2-1 of the first resistance compensation pattern RC1 may be substantially the same as line widths of the first portion P1-2 and the second portion P2-2 of the second resistance compensation pattern RC2. Here, the line widths may correspond to the widths of lines defined in the second direction DR2. The resistance of the first resistance compensation pattern RC1 and the resistance of the second resistance compensation pattern RC2 may be controlled by adjusting the lengths of the first portions P1-1 and P1-2 and the second portions P2-1 and P2-2 in the first direction DR1. However, an embodiment is not limited thereto, and the resistance of the first resistance compensation pattern RC1 and the resistance of the second resistance compensation pattern RC2 may also be controlled by adjusting the line widths of the first portions P1-1 and P1-2 and the second portions P2-1 and P2-2 in the second direction DR2.

A length of the third portion P3-1 of the first resistance compensation pattern RC1 may be substantially the same as a length of the third portion P3-2 of the second resistance compensation pattern RC2. However, an embodiment is not limited thereto.

By adjusting the resistances and/or capacitances of the first resistance compensation pattern RC1 and the second resistance compensation pattern RC2, a resistance and/or capacitance difference between the data line connected to the first resistance compensation pattern RC1 and the data line connected to the second resistance compensation pattern RC2 may be reduced.

The sixth connection pattern CP6 may be disposed closest to the first resistance compensation pattern RC1 in a plan view among the connection patterns CP. The resistance of the first resistance compensation pattern RC1 may be substantially the same as or similar to the resistance of the sixth connection pattern CP6. Furthermore, the capacitance of the first resistance compensation pattern RC1 may be substantially the same as or similar to the capacitance of the sixth connection pattern CP6.

Referring to FIG. 7A, in an embodiment, the resistance and capacitance of the first resistance compensation pattern RC1 may be designed to be smaller than the resistance and capacitance of the sixth connection pattern CP6. However, an embodiment is not limited thereto, and, referring to FIG. 7B, the resistance and capacitance of the first resistance compensation pattern RC1 may be designed to be larger than the resistance and capacitance of the sixth connection pattern CP6 in an embodiment. The disclosure is not limited to any one embodiment unless resistance and capacitance differences significantly increase between the first resistance compensation pattern RC1 and the sixth connection pattern CP6.

Referring to FIG. 7A, the sum of the lengths of the first portion P1-1 and the second portion P2-1 of the first resistance compensation pattern RC1 may be smaller than a length of the first line L1-6 of the sixth connection pattern CP6. Accordingly, the number of data lines DL overlapping the first portion P1-1 and the second portion P2-1 of the first resistance compensation pattern RC1 may be smaller than the number of data lines DL overlapping the first line L1-6 of the sixth connection pattern CP6. For example, referring to FIG. 7A, the first line L1-6 of the sixth connection pattern CP6 may overlap six data lines (the data lines DL7 to DL12 of seventh to 12th columns in FIG. 7A) except for the data line DL6 of a sixth column to which the first line L1-6 of the sixth connection pattern CP6 is electrically connected. Each of the first portion P1-1 and the second portion P2-1 of the first resistance compensation pattern RC1 may overlap, in a plan view, two data lines (the data lines DL8 and LD9 of an eighth and ninth columns in FIG. 7A) except for the data line DL7 of a seventh column to which the first portion P1-1 and the second portion P2-1 of the first resistance compensation pattern RC1 are electrically connected. For example, the total number of data lines DL overlapping the first portion P1-1 and the second portion P2-1 of the first resistance compensation pattern RC1 may be four, which may be smaller than the number of data lines DL overlapping the first line L1-6 of the sixth connection pattern CP6.

The resistance and/or capacitance of the second resistance compensation pattern RC2 may be smaller than the resistance and/or capacitance of the first resistance compensation pattern RC1. For example, the sum of the numbers of data lines DL respectively overlapping the first portion P1-2 and the second portion P2-2 of the second resistance compensation pattern RC2 may be smaller than the sum of the numbers of data lines DL respectively overlapping the first portion P1-1 and the second portion P2-1 of the first resistance compensation pattern RC1. In detail, referring to FIG. 7A, as described above, the sum of the numbers of data lines DL respectively overlapping the first portion P1-1 and the second portion P2-1 of the first resistance compensation pattern RC1 may be four. Each of the first portion P1-2 and the second portion P2-2 of the second resistance compensation pattern RC2 may overlap, in a plan view, one data line (the data line DL9 of a ninth column in FIG. 7A) except for the data line DL8 of an eighth column to which the first portion P1-2 and the second portion P2-2 of the second resistance compensation pattern RC2 are electrically connected. For example, the sum of the numbers of data lines DL respectively overlapping the first portion P1-2 and the second portion P2-2 of the second resistance compensation pattern RC2 may be two, which may be smaller than the sum of the number of data lines DL respectively overlapping the first portion P1-1 and the second portion P2-1 of the first resistance compensation pattern RC1.

The resistances and/or capacitances of the sixth connection pattern CP6, the first resistance compensation pattern RC1, and the second resistance compensation pattern RC2 may sequentially decrease. In this manner, a resistance and/or capacitance difference between data lines respectively connected to the sixth connection pattern CP6, the first resistance compensation pattern RC1, and the second resistance compensation pattern RC2 may be reduced.

Referring to FIG. 7B, the sum of the lengths of the first portion P1-1 and the second portion P2-1 of the first resistance compensation pattern RC1 may be larger than the length of the first line L1-6 of the sixth connection pattern CP6, but a length difference may not be significant. Compared to the embodiment of FIG. 7A, the difference between the sum of the lengths of the first portion P1-1 and the second portion P2-1 of the first resistance compensation pattern RC1 and the length of the first line L1-6 of the sixth connection pattern CP6 illustrated in FIG. 7B may be smaller. For example, a resistance difference between the first resistance compensation pattern RC1 and the sixth connection pattern CP6 may reduce.

Referring to FIG. 7B, the sum of the numbers of data lines DL respectively overlapping the first portion P1-1 and the second portion P2-1 of the first resistance compensation pattern RC1 may be substantially the same the number of data lines DL overlapping the first line L1-6 of the sixth connection pattern CP6. For example, referring to FIG. 7B, the first line L1-6 of the sixth connection pattern CP6 may overlap six data lines (the data lines DL7 to DL12 of seventh to 12th columns in FIG. 7B) except for the data line DL6 of a sixth column to which the first line L1-6 of the sixth connection pattern CP6 is electrically connected. Each of the first portion P1-1 and the second portion P2-1 of the first resistance compensation pattern RC1 may overlap, in a plan view, three data lines (the data lines DL8 to DL10 of eighth to 10th columns in FIG. 7B) except for the data line DL7 of a seventh column to which the first portion P1-1 and the second portion P2-1 of the first resistance compensation pattern RC1 are electrically connected. For example, the total number of data lines DL overlapping the first portion P1-1 and the second portion P2-1 of the first resistance compensation pattern RC1 may be six, which may be the same as the number of data lines DL overlapping the first line L1-6 of the sixth connection pattern CP6.

Compared to the embodiment of FIG. 7A, the difference between the sum of the numbers of data lines respectively overlapping the first portion P1-1 and the second portion P2-1 of the first resistance compensation pattern RC1 and the number of data lines overlapping the first line L1-6 of the sixth connection pattern CP6 illustrated in FIG. 7B may be smaller. For example, a capacitance difference between the first resistance compensation pattern RC1 and the sixth connection pattern CP6 may reduce.

Therefore, a magnitude relationship between the resistance and capacitance of connection patterns and the resistance and capacitance of resistance compensation patterns is not limited to any one embodiment, provided that resistance and capacitance differences between the resistance compensation patterns and the connection patterns are designed to be minimized. The magnitude relationship between the resistances and capacitances of connection patterns and resistance compensation patterns may be changed according to the number or arrangement of the data lines DL included in the display panel DP.

Figure 8:
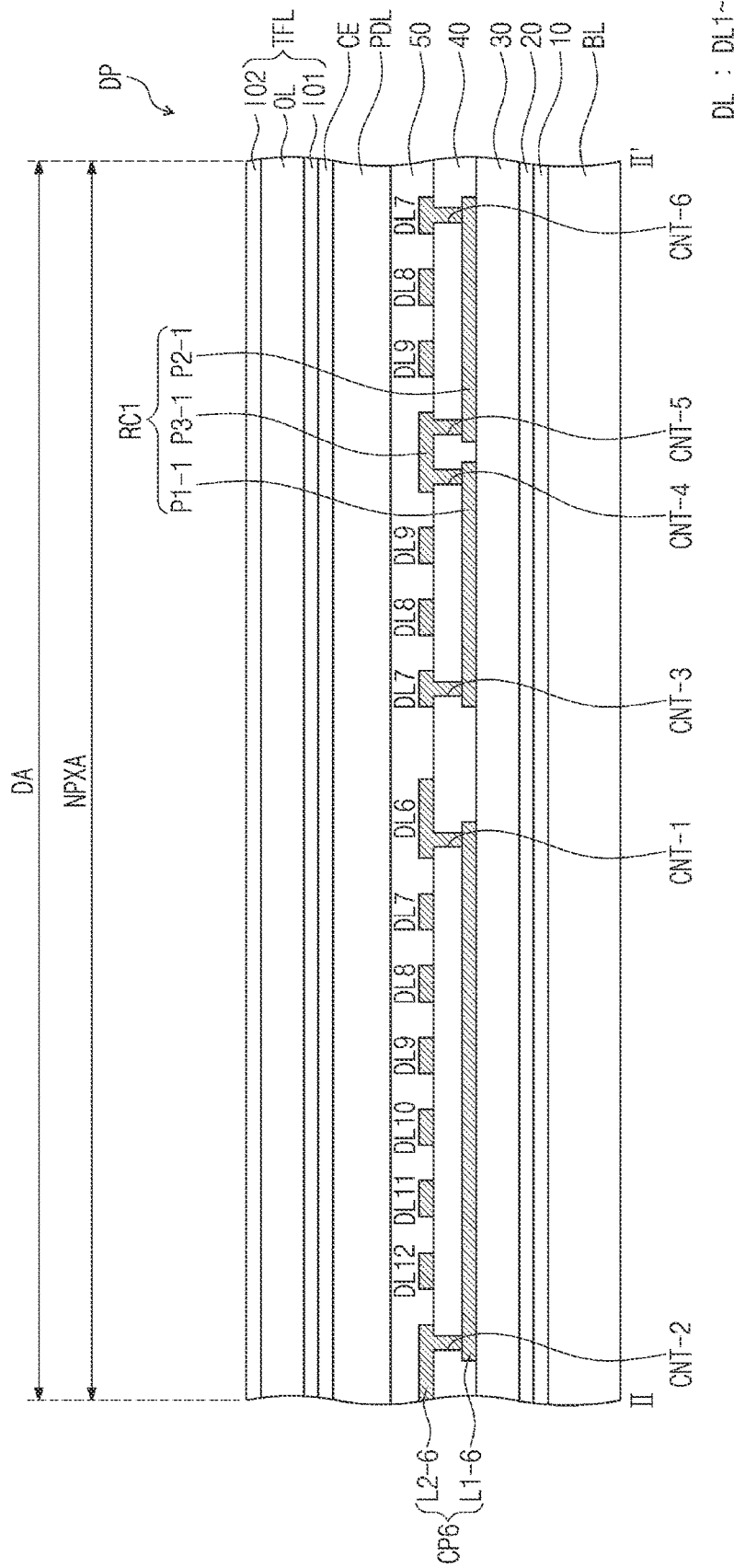
FIG. 8 is a schematic cross-sectional view of a display panel according to an embodiment.

FIG. 8 is a schematic cross-sectional view of a display panel according to an embodiment. FIG. 8 is a schematic cross-sectional view of the display panel DP taken along line II-IF illustrated in FIG. 7A. FIG. 8 illustrates, as an example, a cross-section corresponding to an area in which the first resistance compensation pattern RC1 is disposed, and the following descriptions are provided on the basis of the first resistance compensation pattern RC1.

Referring to FIG. 8, the first resistance compensation pattern RC1 may be disposed in the display area DA. The first resistance compensation pattern RC1 may overlap the non-emission area NPXA of the display area DA. However, an embodiment is not limited thereto, and a portion of the first resistance compensation pattern RC1 may overlap the emission area PXA (see FIG. 4A) according to arrangement of the pixel electrode AE (see FIG. 4A). The first resistance compensation pattern RC1 may include the first portion P1-1, the second portion P2-1, and the third portion P3-1.

The first portion P1-1, the second portion P2-1, and the third portion P3-1 of the first resistance compensation pattern RC1 may be disposed on the third insulating layer 30. The first portion P1-1 and the second portion P2-1 may be disposed on a same layer as the first line L1-6 of the sixth connection pattern CP6 disposed adjacent to the first resistance compensation pattern RC1.

Each of the first portion P1-1 and the second portion P2-1 of the first resistance compensation pattern RC1 may overlap the data lines DL8 and DL9 of eighth and ninth columns. The number of data lines overlapping the first portion P1-1 and the second portion P2-1 may affect the capacitance of the first resistance compensation pattern RC1.

The number of data lines overlapping the first portion P1-1 and the second portion P2-1 of the first resistance compensation pattern RC1 may be substantially the same as or slightly different from the number of data lines overlapping the first line L1-6 of the sixth connection pattern CP6. For example, referring to FIG. 8, each of the first portion P1-1 and the second portion P2-1 of the first resistance compensation pattern RC1 may overlap two data lines, and the first resistance compensation pattern RC1 may have an effect of overlapping four data lines in total. The first line L1-6 of the sixth connection pattern CP6 may overlap six data lines.

As a difference between the number of data lines overlapping the first portion P1-1 and the second portion P2-1 of the first resistance compensation pattern RC1 and the number of data lines overlapping the first line L1-6 of the sixth connection pattern CP6 decreases, a capacitance difference between the first resistance compensation pattern RC1 and the sixth connection pattern CP6 may decrease. A capacitance difference with the sixth connection pattern CP6 may be controlled by adjusting the number of data lines overlapping the first portion P1-1 and the second portion P2-1 of the first resistance compensation pattern RC1.

The sum of the lengths of the first portion P1-1 and the second portion P2-1 of the first resistance compensation pattern RC1 may be substantially the same as or similar to the length of the first line L1-6 of the sixth connection pattern CP6. As a difference between the sum of the lengths of the first portion P1-1 and the second portion P2-1 of the first resistance compensation pattern RC1 and the length of the first line L1-6 of the sixth connection pattern CP6 decreases, a resistance difference between the first resistance compensation pattern RC1 and the sixth connection pattern CP6 may decrease. A resistance difference with the sixth connection pattern CP6 may be controlled by adjusting the lengths of the first portion P1-1 and the second portion P2-1 of the first resistance compensation pattern RC1.

The third portion P3-1 of the first resistance compensation pattern RC1 may be disposed on the fourth insulating layer 40. The third portion P3-1 may be disposed on a same layer as the data lines DL and the second line L2-6 of the sixth connection pattern CP6.

One end or an end of the first portion P1-1 may be connected to the data line DL7 of a seventh column through the third contact hole CNT-3 penetrating the fourth insulating layer 40. The other end or another end of the first portion P1-1 may be connected to one end or an end of the third portion P3-1 through the fourth contact hole CNT-4 penetrating the fourth insulating layer 40. One end or an end of the second portion P2-1 may be connected to the other end or another end of the third portion P3-1 through the fifth contact hole CNT-5 penetrating the fourth insulating layer 40, and the other end or another end of the second portion P2-1 may be connected to the data line DL7 of a seventh column through the sixth contact hole CNT-6 penetrating the fourth insulating layer 40.

A laminate structure of the first resistance compensation pattern RC1 is not limited to that illustrated in FIG. 8. Although FIG. 8 illustrates that the first and second portions P1-1 and P2-1 and the third portion P3-1 of the first resistance compensation pattern RC1 are disposed on different layers, an embodiment is not limited thereto, and the third portion P3-1 may be disposed on a same layer as the first portion P1-1 and the second portion P2-1 so as to be integral. By way of example, the first portion P1-1 and the second portion P2-1 of the first resistance compensation pattern RC1 may be disposed on an upper layer than that of the third portion P3-1. For example, the data lines DL and the third portion P3-1 of the first resistance compensation pattern RC1 may be disposed on the third insulating layer 30, and the first portion P1-1 and the second portion P2-1 of the first resistance compensation pattern RC1 may be disposed on the fourth insulating layer 40 that is an upper layer of the data lines DL.

Figure 9:
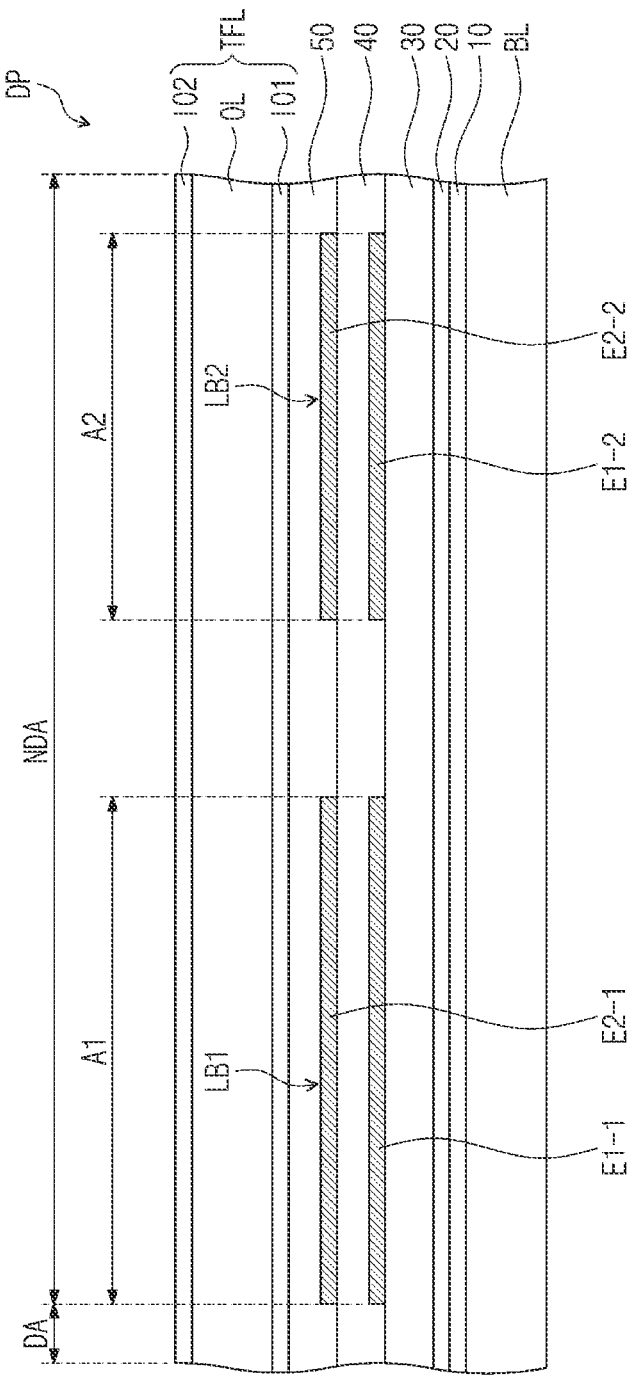
FIG. 9 is a schematic cross-sectional view of a display panel according to an embodiment.

FIG. 9 is a schematic cross-sectional view of a display panel according to an embodiment. FIG. 9 illustrates schematic cross-sections of the load blocks LB1 and LB2 provided in a form of a capacitor. The following descriptions are focused on the load blocks LB1 and LB2 provided as capacitors.

FIG. 9 illustrates, as an example, the first load block LB1 provided as a first capacitor and the second load block LB2 provided as a second capacitor. Hereinafter, for convenience, the first load block LB1 is referred to as a first capacitor LB1, and the second load block LB2 is referred to as a second capacitor LB2.

Each of the capacitors LB1 and LB2 may be arranged in the non-display area NDA. Each of the capacitors LB1 and LB2 may be arranged in the non-display area NDA adjacent to an upper end of the display panel DP. Therefore, the capacitors LB1 and LB2, in a plan view, may be spaced apart from the connection lines DCL (see FIG. 5) arranged in the non-display area NDA adjacent to a lower end of the display panel DP. However, an embodiment is not limited thereto, and the capacitors LB1 and LB2 may be arranged in the display area DA.

Each of the first and second capacitors LB1 and LB2 may be connected to a corresponding data line among the data lines of the second group G2 (see FIG. 5). The first capacitor LB1 may be connected to the data line DL7 (see FIG. 6B) of a seventh column, and the second capacitor LB2 may be connected to the data line DL8 (see FIG. 6B) of an eighth column.

The first capacitor LB1 may include the first electrode E1-1 disposed on the third insulating layer 30 and the second electrode E2-1 disposed on the fourth insulating layer 40 and connected to the data line DL7 (see FIG. 6B) of a seventh column. The second electrode E2-1 of the first capacitor LB1 may be connected to the data line DL7 (see FIG. 6B) of a seventh column on a same layer so as to form a shape of one piece.

The second capacitor LB2 may include the first electrode E1-2 disposed on the third insulating layer 30 and the second electrode E2-2 disposed on the fourth insulating layer 40. The second electrode E2-2 of the second capacitor LB2 may be connected to the data line DL8 (see FIG. 6B) of an eighth column in a plan view.

A capacitance of the first capacitor LB1 may be different from a capacitance of the second capacitor LB2. The capacitance of the first capacitor LB1 connected to the data line DL7 (see FIG. 5) of a seventh column disposed closest to the data lines of the first group G1 (see FIG. 5) may be larger than the capacitance of the second capacitor LB2 connected to the data line DL8 (see FIG. 6B) of an eighth column. Planar area sizes of the electrodes included in the first and second capacitors LB1 and LB2 may affect the capacitances of the first and second capacitors LB1 and LB2. Therefore, a planar area size A1 of the electrodes E1-1 and E2-1 of the first capacitor LB1 may be larger than a planar area size A2 of the electrodes E1-2 and E2-2 of the second capacitor LB2.

The capacitances of the sixth connection pattern CP6 (see FIG. 5), the first capacitor LB1, and the second capacitor LB2 may sequentially reduce. In this manner, a capacitance difference between the sixth connection pattern CP6 (see FIG. 5), the first capacitor LB1, and the second capacitor LB2 may be reduced.

Figure 10:
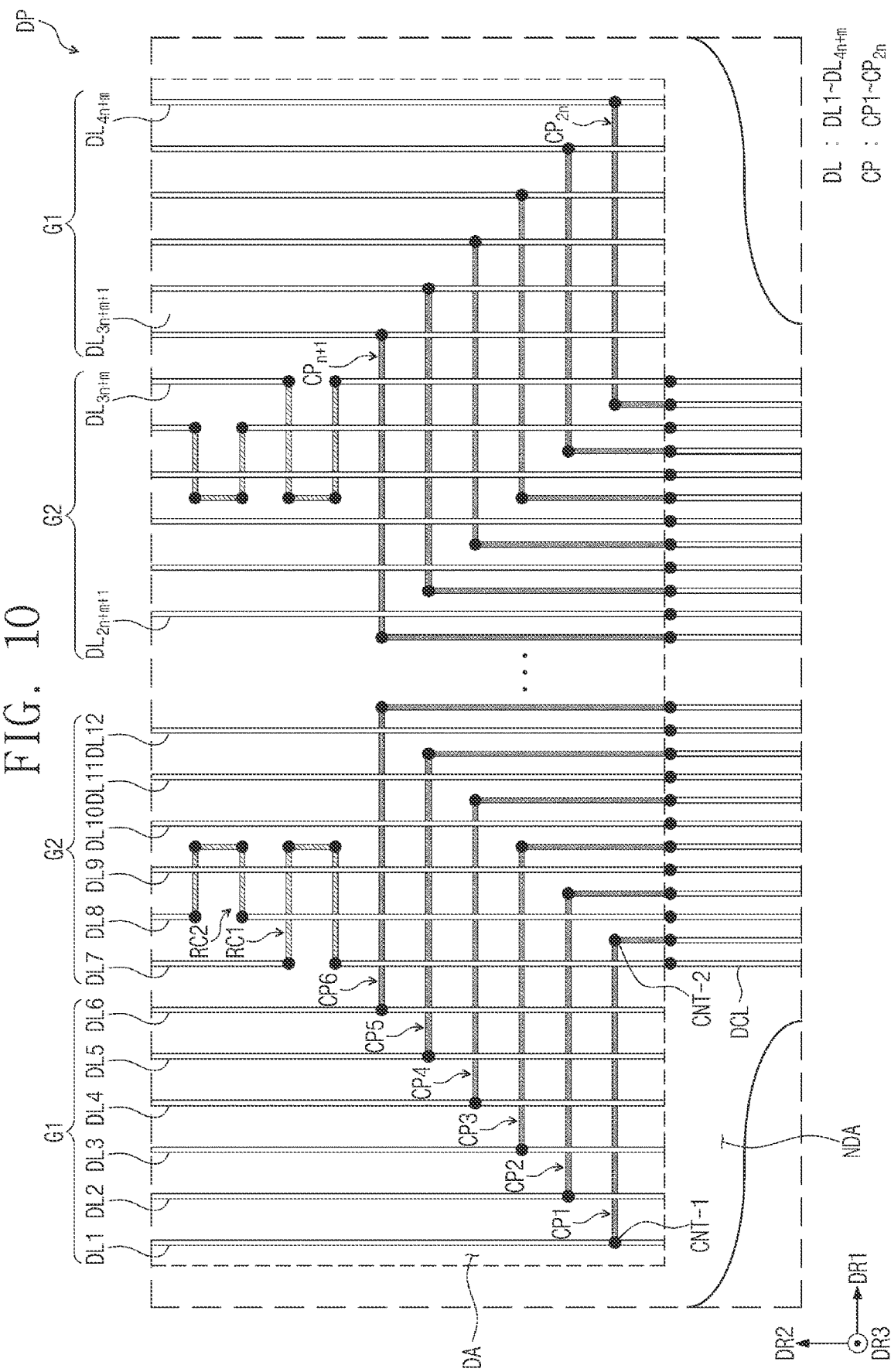
FIG. 10 is an enlarged schematic plan view illustrating a display panel according to an embodiment.

FIG. 10 is an enlarged schematic plan view of a display panel according to an embodiment. FIG. 10 illustrates an enlarged schematic plan view of one area or an area of the display panel DP, which corresponds to an area between the left boundary of the display area DA and the right boundary of the display area DA, and in which the connection patterns CP1, CP2, $CP_{n+1}$, and $CP_{2n}$ are disposed. FIG. 10 may include substantially the same configuration as that of the display panel DP illustrated in FIG. 7A, and only differs from FIG. 7A in terms of a size of an illustrated area.

Referring to FIG. 10, the data lines DL1 to DL6 of the first group G1 disposed on the left side and the connection patterns CP1 to CP6 connected thereto may form a symmetric shape with the data lines $DL_{3n+m+1}$ to $DL_{4n+m}$ of the first group G1 disposed on the right side and the connection patterns $CP_{n+1}$ to $CP_{2n}$ connected thereto with respect to a virtual center line extending in the second direction DR2. The data lines DL7 to DL12 of the second group G2 disposed on the left side and the resistance compensation patterns RC1 and RC2 connected thereto may form a symmetric shape with the data lines $DL_{2n+m+1}$ to $DL_{3n+m}$ of the second group G2 disposed on the right side and the resistance compensation patterns connected thereto with respect to the virtual center line extending in the second direction DR2.

The connection patterns CP that electrically connect the data driver DDV (see FIG. 2) and the data lines DL disposed adjacent to the two boundaries of the display area DA may be connected to the data lines DL via the display area DA, thus reducing a size of the non-display area NDA in which wirings are disposed. As a result, the electronic apparatus ED having a relatively light weight and a wide display area DA may be provided to a user.

The connection patterns CP may have substantially the same resistance and capacitance, and may reduce the resistance and capacitance differences between the data lines of the first group G1 connected to the connection patterns CP, thereby preventing the degradation of display quality.

The data lines of the second group G2 may be not connected to the connection patterns CP and may be arranged in the first direction DR1 from the data lines of the first group G1 and at least one of the data lines of the second group G2 may be connected to a load block. The load blocks may reduce the resistance and capacitance differences between the data lines of the first group G1 and the data lines of the second group G2. In this manner, the degradation of display quality due to sharp changes in resistance and capacitance between data lines may be prevented.

Since a display panel of an embodiment may include a connection pattern connected to signal lines, a size of an area in which the signal lines are disposed may be reduced, and a phenomenon of signal delay due to an increase in resistance and capacitance may be resolved.

Since a display panel of an embodiment may include a load block connected to a signal line, a phenomenon of degradation of display quality due to a sharp change in resistance and capacitance may be resolved.

Although embodiments have been described, it is understood that the disclosure should not be limited to these embodiments but various changes and modifications can be made by one of ordinary skill in the art within the spirit and scope of the disclosure and as hereinafter claimed.

What is claimed is:

1. A display panel comprising:
   a base layer comprising a display area and a non-display area;
   signal lines disposed in a first direction, each of the signal lines extending in a second direction intersecting the first direction; and
   connection patterns comprising first lines and second lines, wherein
   each of the first lines is electrically connected to at least one of the signal lines through a contact portion and extends in the first direction,
   each of the second lines is electrically connected to a corresponding first line among the first lines and extends in the second direction,
   the contact portion between the first lines and the signal lines is disposed in the display area,
   the first lines of the connection patterns are disposed in the display area and have a same length, and
   the connection patterns do not overlap each other in a plan view,
   wherein the signal lines comprise:
      signal lines of a first group each electrically connected to the first lines of the connection patterns; and
      signal lines of a second group insulated from the signal lines of the first group and intersecting at least one of the first lines of the connection patterns.

2. The display panel of claim 1, wherein
   the second lines of the connection patterns are disposed between the signal lines in a plan view.

3. The display panel of claim 1, wherein the first lines of the connection patterns and the second lines of the connection patterns are disposed on different layers.

4. The display panel of claim 1, wherein the first lines and the second lines of the connection patterns are disposed on a same layer and are integral with each other.

5. The display panel of claim 1, wherein the second lines of the connection patterns and the signal lines are disposed on a same layer.

6. The display panel of claim 1, wherein
   each of the first lines intersects at least one of the signal lines in a plan view, and
   each of the first lines has a same number of overlapping signal lines in a plan view.

7. The display panel of claim 1, wherein
   the base layer comprises sides extending in the second direction, and
   the signal lines of the first group are disposed closer to the sides of the base layer than the signal lines of the second group.

8. The display panel of claim 1, further comprising:
   a load block electrically connected to at least one of the signal lines of the second group.

9. The display panel of claim 8, wherein the load block comprises at least one capacitor.

10. The display panel of claim 9, wherein
    the at least one capacitor comprises a plurality of capacitors and electrically connected to different signal lines of the second group, respectively,
    the plurality of capacitors comprise:
       a first capacitor electrically connected to a first signal line among the signal lines of the second group; and
       a second capacitor electrically connected to a second signal line among the signal lines of the second group,
    the first signal line is disposed closer to the signal lines of the first group than the second signal line in the first direction, and
    a capacitance of the first capacitor is larger than a capacitance of the second capacitor.

11. The display panel of claim 8, wherein
    the load block comprises at least one resistance compensation pattern, and
    the at least one resistance compensation pattern comprises:
       a first portion and a second portion each electrically connected to a corresponding signal line among the signal lines of the second group and extending in the first direction; and
       a third portion electrically connected to the first portion and the second portion and extending in the second direction.

12. The display panel of claim 11, wherein the first portion, the second portion, and the third portion are disposed on different layers.

13. The display panel of claim 11, wherein the first portion, the second portion, and the first lines of the connection patterns are disposed on a same layer.

14. The display panel of claim 11, wherein
    the at least one resistance compensation pattern comprises a plurality of resistance compensation patterns and electrically connected to different signal lines of the second group, respectively,
    the plurality of resistance compensation patterns comprise:
       a first resistance compensation pattern electrically connected to a first signal line among the signal lines of the second group; and
       a second resistance compensation pattern electrically connected to a second signal line among the signal lines of the second group,
    the first signal line is disposed closer to the signal lines of the first group than the second signal line in the first direction, and
    a resistance of the first resistance compensation pattern is larger than a resistance of the second resistance compensation pattern.

15. The display panel of claim 14, wherein a sum of lengths of a first portion and a second portion of the first resistance compensation pattern is greater than a sum of lengths of a first portion and a second portion of the second resistance compensation pattern.

16. The display panel of claim 14, wherein
    each of the first portion of the first resistance compensation pattern and the first portion of the second resistance compensation pattern overlaps at least one of the signal lines in a plan view, and a number of signal lines overlapping the first portion of the first resistance compensation pattern in a plan view is greater than a number of signal lines overlapping the first portion of the second resistance compensation pattern in a plan view.

17. An electronic apparatus comprising:
a display panel including:
  a base layer;
  a circuit element layer disposed on the base layer; and
  a display element layer disposed on the circuit element layer,
wherein the circuit element layer comprises:
signal lines disposed on the base layer, disposed in a first direction, and each of the signal lines extending in a second direction intersecting the first direction;
connection patterns each comprising:
  a first line extending in the first direction; and
  a second line electrically connected to the first line and extending in the second direction; and
a load block, wherein
the signal lines comprise:
  signal lines of a first group each electrically connected to the first lines of the connection patterns;
  signal lines of a second group insulated from the signal lines of the first group and intersecting the first lines of the connection patterns; and
  signal lines of a third group insulated from the signal lines of the second group and spaced apart from the connection patterns,
the load block is connected to at least one of the signal lines of the second group, and
the first lines of the connection patterns have a same length.

18. The electronic apparatus of claim 17, further comprising:
an input sensing layer disposed on the display panel that senses an external input.

19. The electronic apparatus of claim 17, further comprising:
a camera module disposed below the display panel.

20. A display panel comprising:
a base layer;
signal lines disposed on the base layer, disposed in a first direction, and each of the signal lines extending in a second direction intersecting the first direction;
connection patterns each comprising:
  a first line extending in the first direction; and
  a second line electrically connected to the first line and extending in the second direction; and
resistance compensation patterns each comprising:
  a first portion and a second portion extending in the first direction; and
  a third portion electrically connected to each of the first portion and the second portion and extending in the second direction, wherein
the signal lines comprise:
  signal lines of a first group respectively electrically connected to the connection patterns; and
  signal lines of a second group spaced apart from the signal lines of the first group in the first direction and respectively electrically connected to the resistance compensation patterns, and
lengths of the first portions of the resistance compensation patterns gradually decrease as a signal line electrically connected to the first portion is disposed farther away from the signal lines of the first group.

21. The display panel of claim 20, wherein
lengths of the first lines of the connection patterns are equal, and
a length of the first portion of each of the resistance compensation patterns is different from the lengths of each of the first lines.

* * * * *